(12) United States Patent
Dutta

(10) Patent No.: US 8,174,059 B2
(45) Date of Patent: May 8, 2012

(54) MULTICOLOR PHOTODIODE ARRAY AND METHOD OF MANUFACTURING

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 294 days.

(21) Appl. No.: 12/420,036

(22) Filed: Apr. 7, 2009

(65) Prior Publication Data

US 2009/0189208 A1 Jul. 30, 2009

Related U.S. Application Data

(62) Division of application No. 11/162,523, filed on Sep. 13, 2005, now Pat. No. 7,535,033.

(51) Int. Cl.
  *H01L 25/16* (2006.01)
(52) U.S. Cl. ............................ 257/291; 257/E25.032
(58) Field of Classification Search ................ None
  See application file for complete search history.

(56) References Cited

U.S. PATENT DOCUMENTS

| | | | | |
|---|---|---|---|---|
| 4,292,512 A * | 9/1981 | Miller et al. | ................ | 250/205 |
| 5,654,578 A * | 8/1997 | Watanabe | ................ | 257/438 |
| 6,510,195 B1 * | 1/2003 | Chappo et al. | ................ | 378/19 |
| 6,876,086 B2 * | 4/2005 | Sekine et al. | ................ | 257/777 |
| 7,326,907 B2 * | 2/2008 | Shibayama et al. | ........ | 250/214.1 |
| 7,504,637 B2 * | 3/2009 | Thorne | ................ | 250/370.09 |
| 2002/0054659 A1 * | 5/2002 | Okumura et al. | ............... | 378/19 |
| 2002/0126364 A1 * | 9/2002 | Miles | ................ | 359/247 |
| 2003/0209652 A1 * | 11/2003 | Fujii et al. | ................ | 250/214.1 |
| 2003/0218120 A1 * | 11/2003 | Shibayama | ................ | 250/214.1 |
| 2004/0065839 A1 * | 4/2004 | Elgali | ................ | 250/370.11 |
| 2004/0135224 A1 * | 7/2004 | Bui et al. | ................ | 257/461 |
| 2011/0044367 A1 * | 2/2011 | Budd et al. | ................ | 372/50.21 |

\* cited by examiner

*Primary Examiner* — Benjamin Sandvik

(57) ABSTRACT

Novel structures of the photodetector having broad spectral ranges detection capability are provided. The photodetector offers high quantum efficiency>95% over wide spectral ranges, high frequency response>10 GHz (@3 dB). The photodiode array of N×N (or M×N) elements is also provided. The array also offers wide spectral detection ranges ultraviolet to 2500 nm with high quantum efficiency>95% and high frequency response of >10 GHz, cross-talk of <0.1%. In the array, each photodiode is independently addressable and is made either as top-illuminated or as bottom illuminated type detector. The photodiode and its array provided in this invention, could be used in multiple purpose applications such as telecommunication, imaging, and sensing applications including surveillance, satellite tracking, advanced lidar systems, etc. The advantages of this photodetectors are that they are uncooled and performance will not be degraded under wide range of temperature variation.

16 Claims, 28 Drawing Sheets

FIG. 4A — Epitaxial growth

FIG. 4B — Patterning and top ohmic contact

FIG. 4C — Etching to open the Incident surface

FIG. 4D — Substrate polishing, bottom ohmic contact, and AR coating

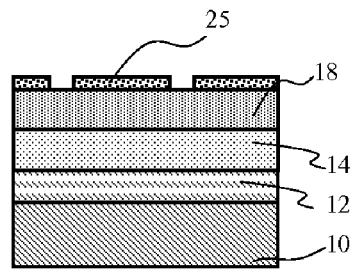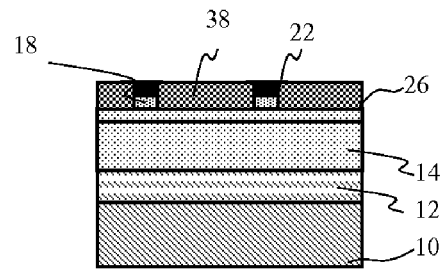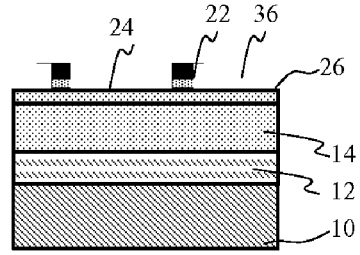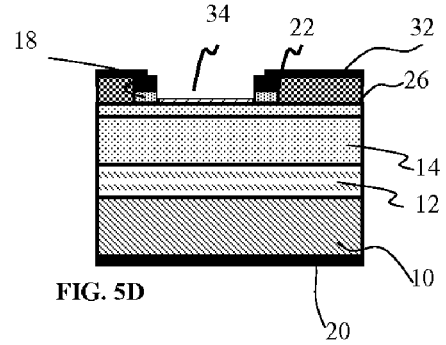
FIG. 5
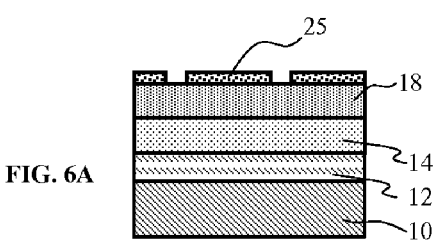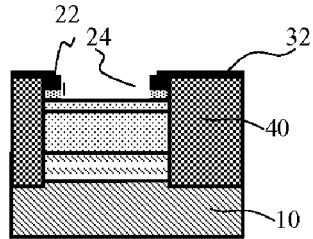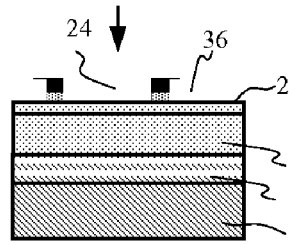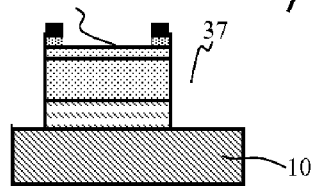
FIG. 6

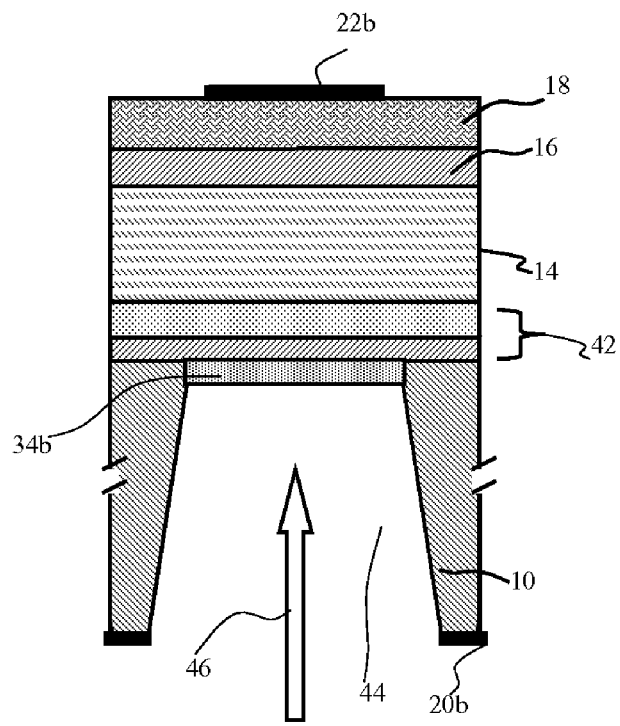
FIG. 7A (0.3 to 1.7 μm)
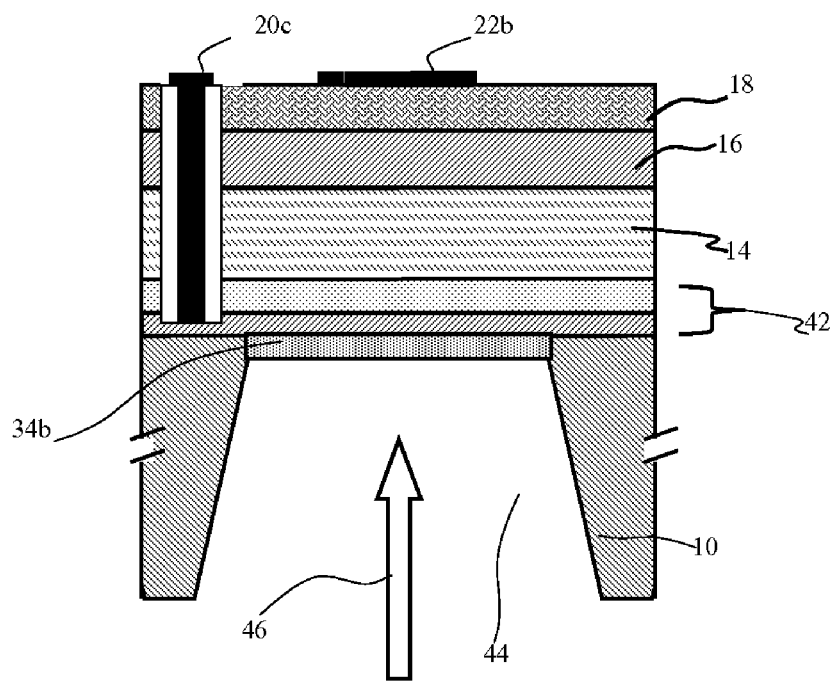
FIG. 7B (0.3 to 1.7 μm)

FIG. 8 (0.3 to 2.5 μm)

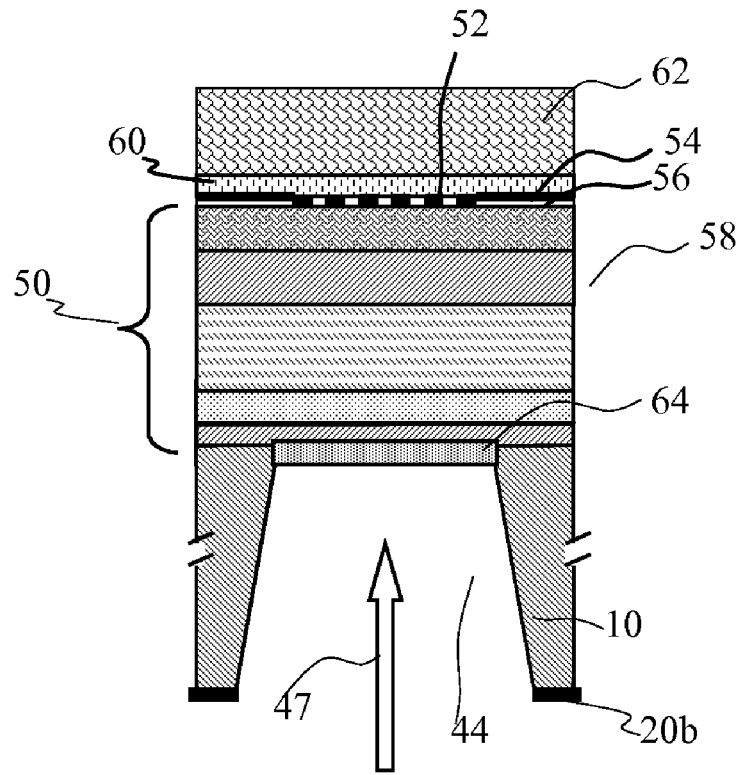
FIG. 9A
FIG. 9
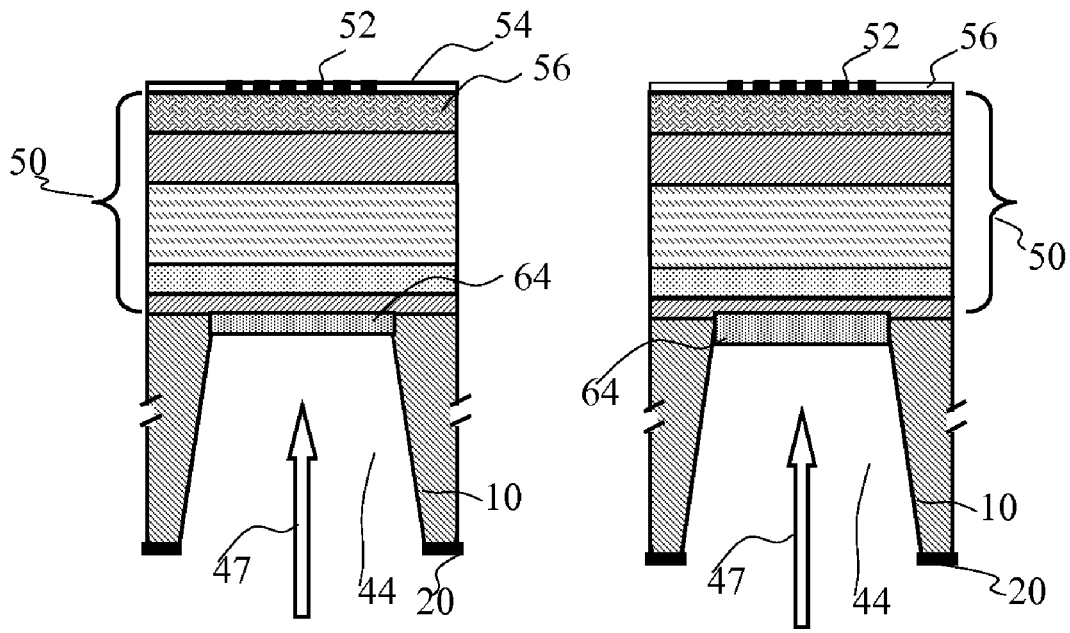
FIG. 9B  FIG. 9C

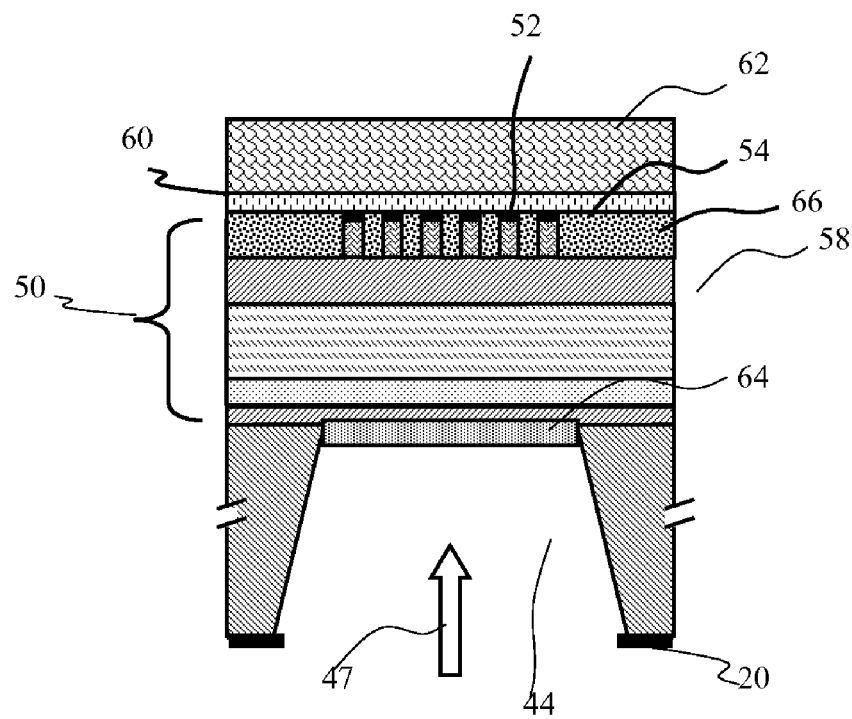
FIG. 10A
FIG. 10
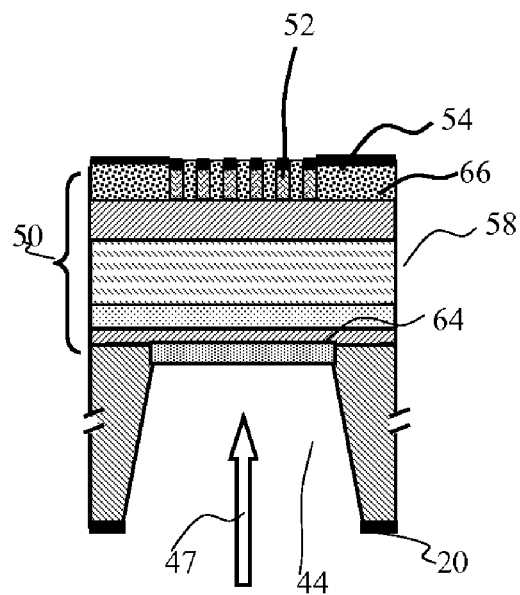
FIG. 10B
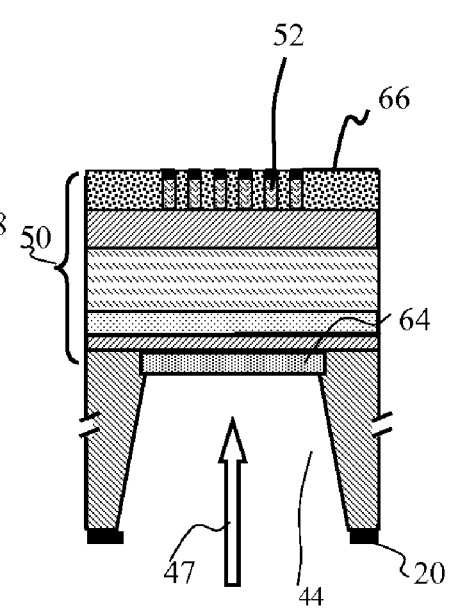
FIG. 10C
FIG. 10

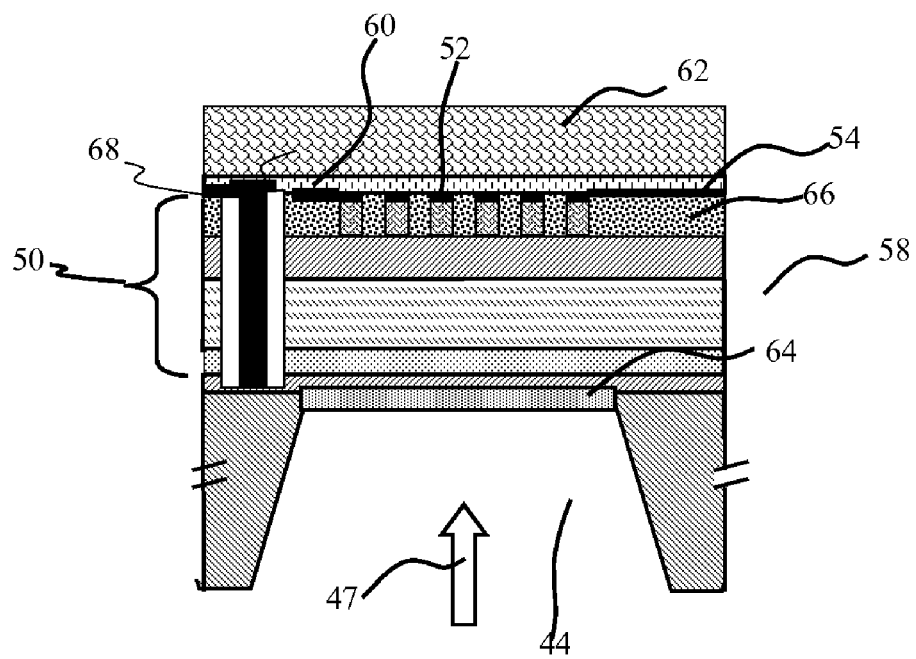
FIG. 11A
FIG. 11
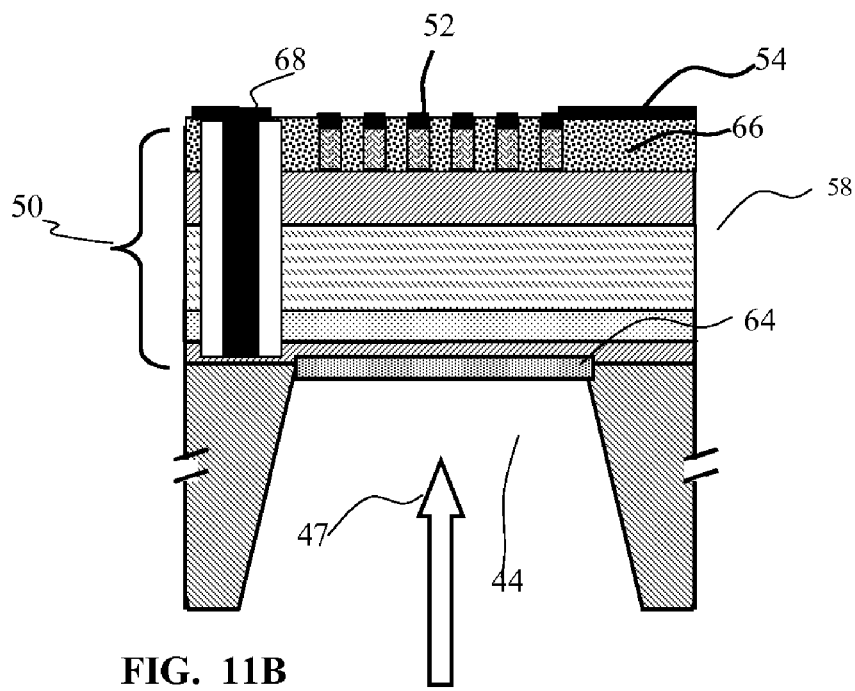
FIG. 11B
FIG. 11

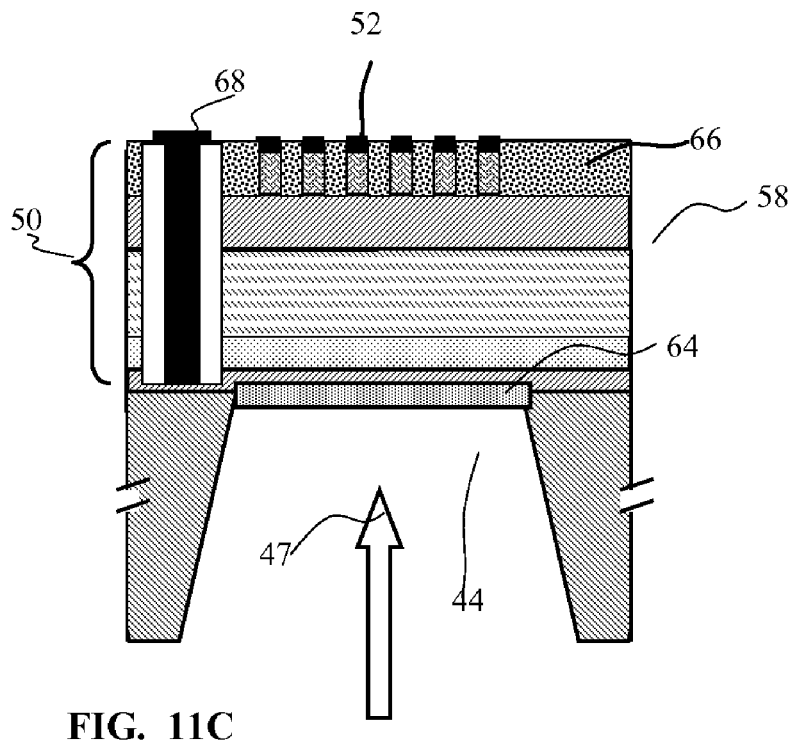
FIG. 11C
FIG. 11
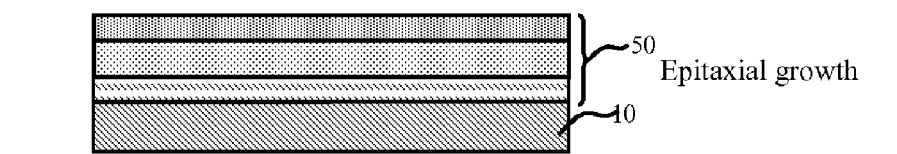
FIG. 12A
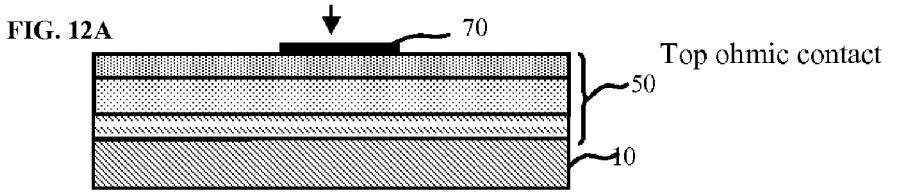
FIG. 12B
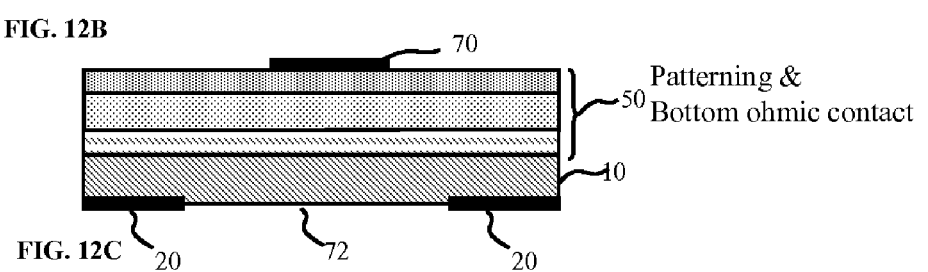
FIG. 12C
FIG. 12

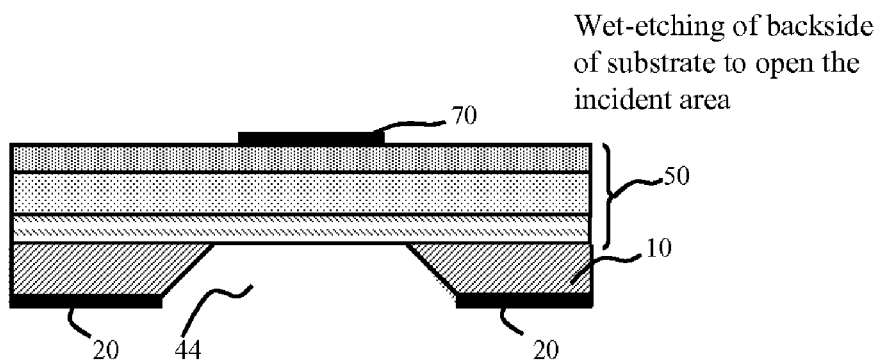
Wet-etching of backside of substrate to open the incident area
FIG. 12D
FIG. 12
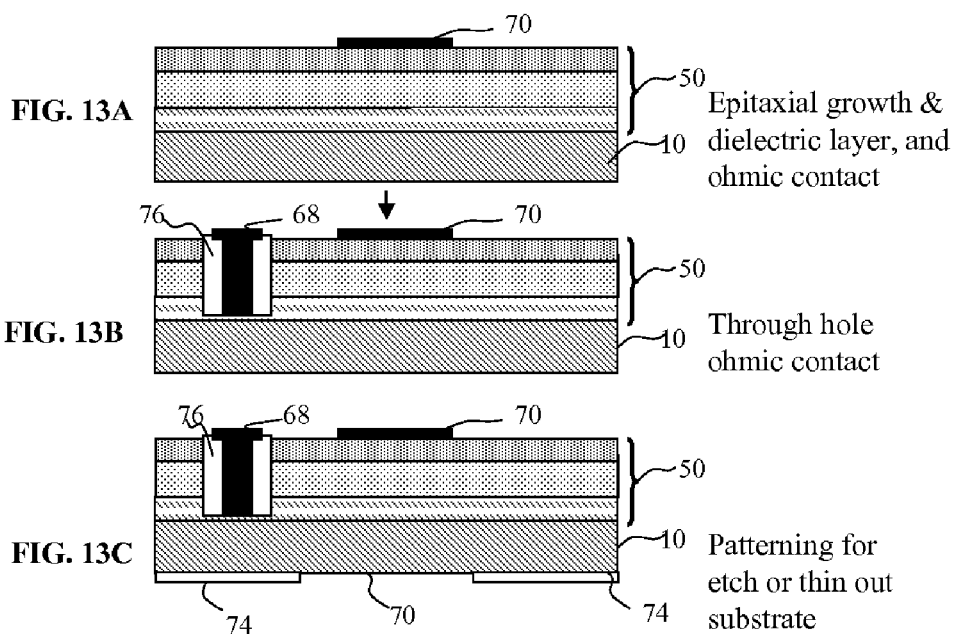
FIG. 13A — Epitaxial growth & dielectric layer, and ohmic contact
FIG. 13B — Through hole ohmic contact
FIG. 13C — Patterning for etch or thin out substrate
FIG. 13

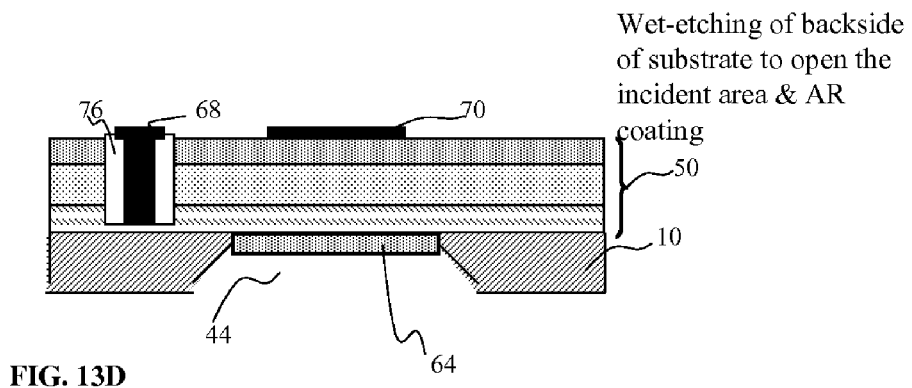
FIG. 13D
FIG. 13
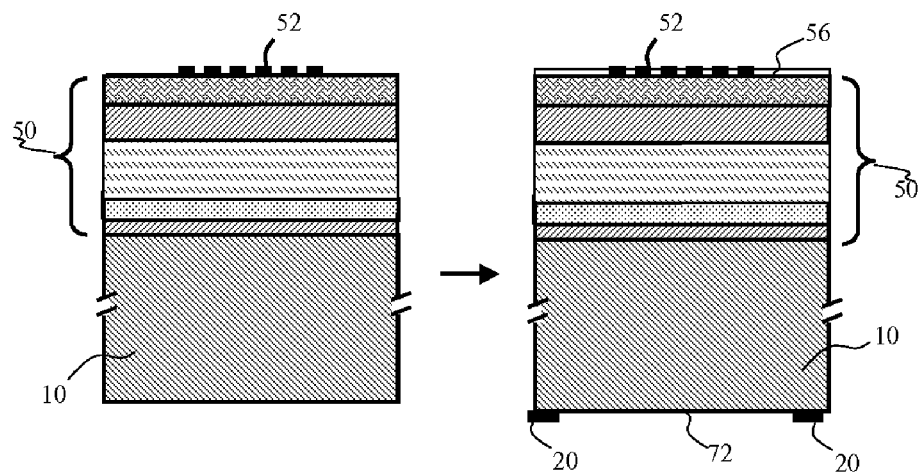
FIG. 14A     FIG. 14B
FIG. 14

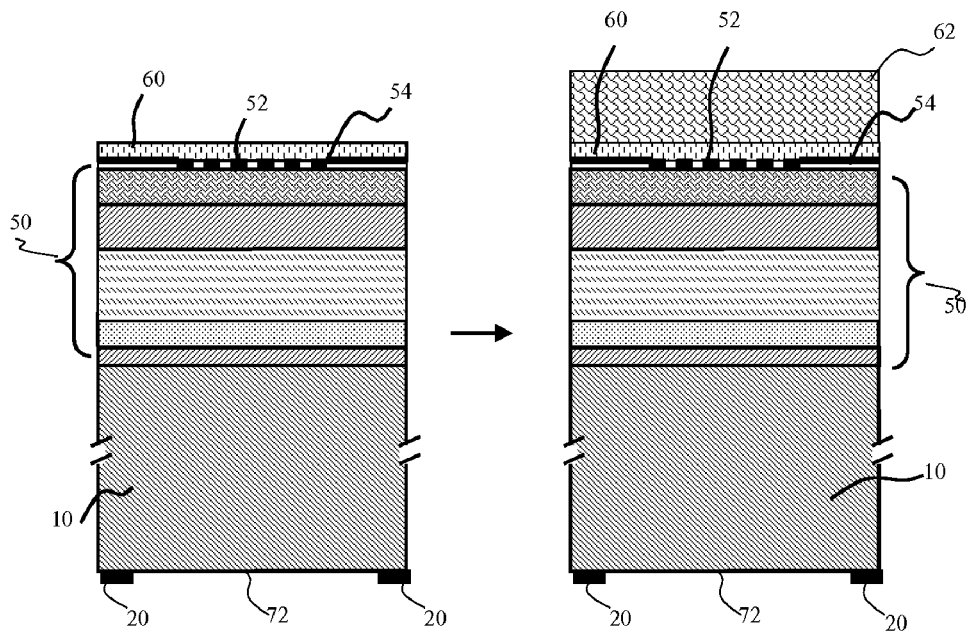
FIG. 14C    FIG. 14D
FIG. 14
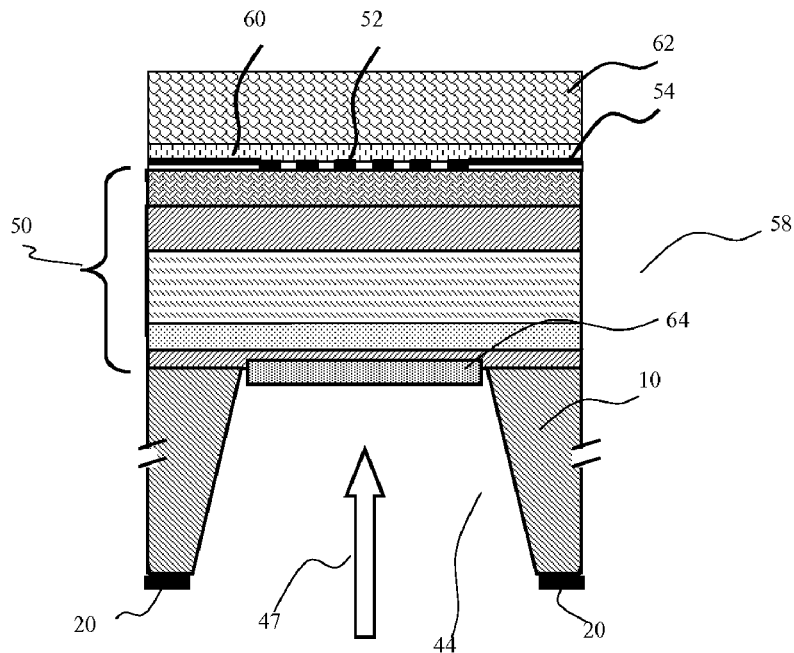
FIG. 14E
FIG. 14

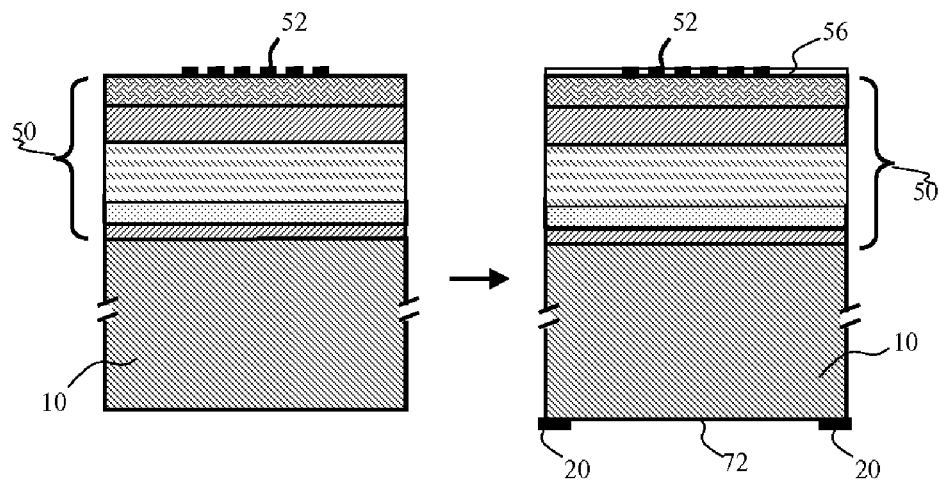
FIG. 15A    FIG. 15B
FIG. 15
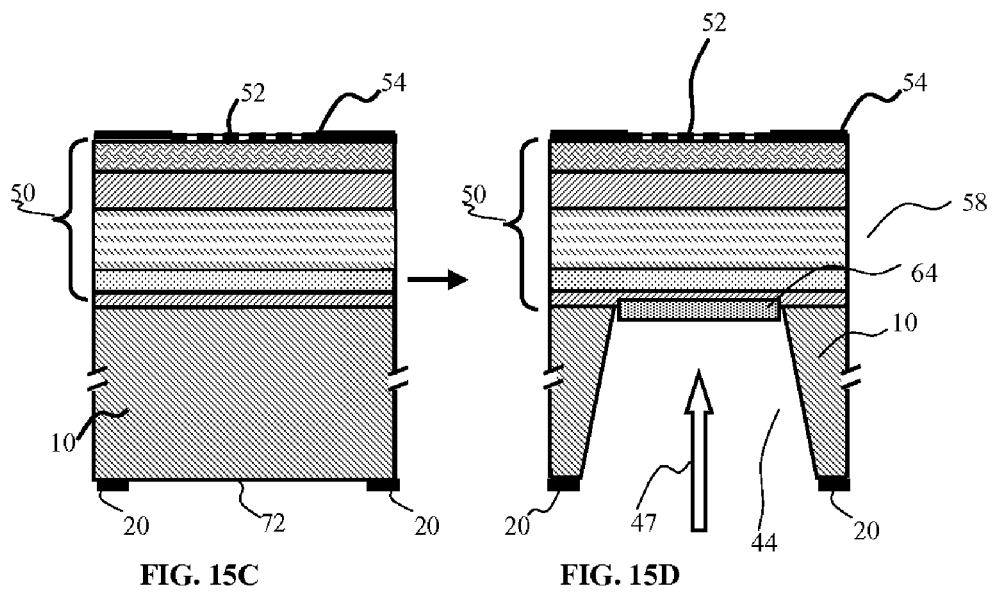
FIG. 15C    FIG. 15D
FIG. 15

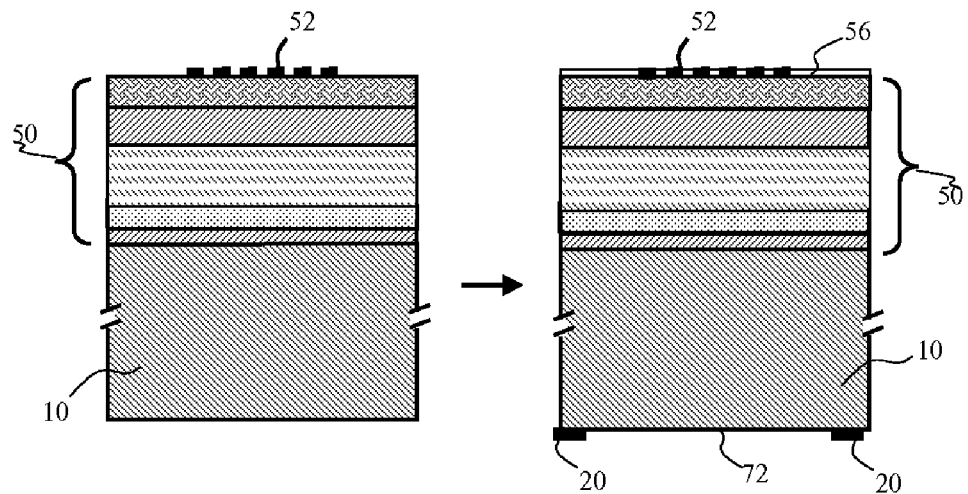
FIG. 16A        FIG. 16B
FIG. 16
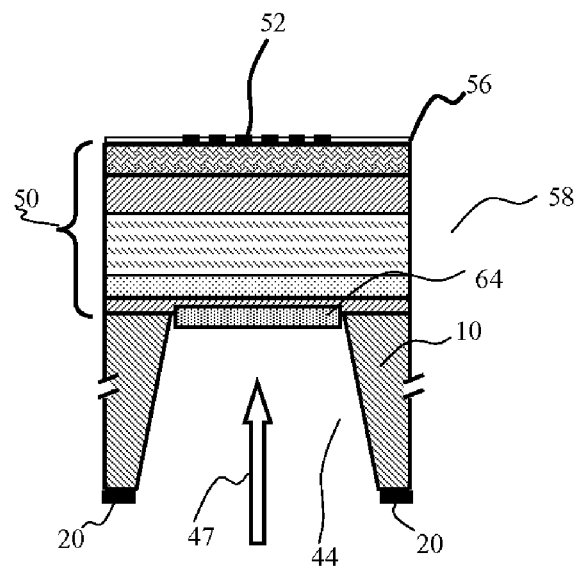
FIG. 16C
FIG. 16

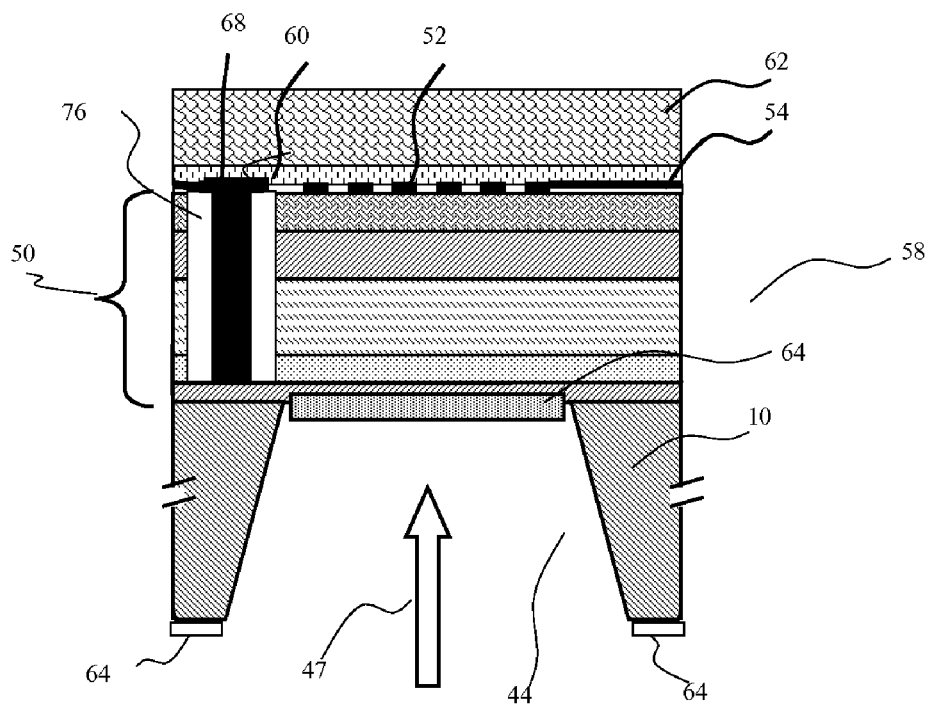
FIG. 17E
FIG. 17
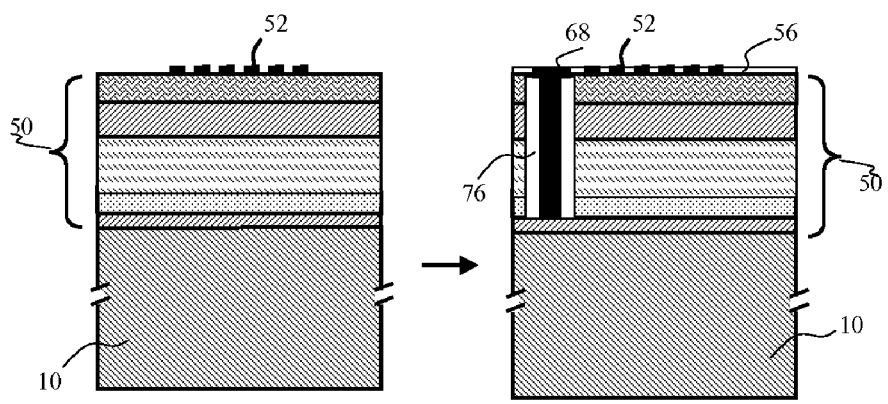
FIG. 18A          FIG. 18B
FIG. 18

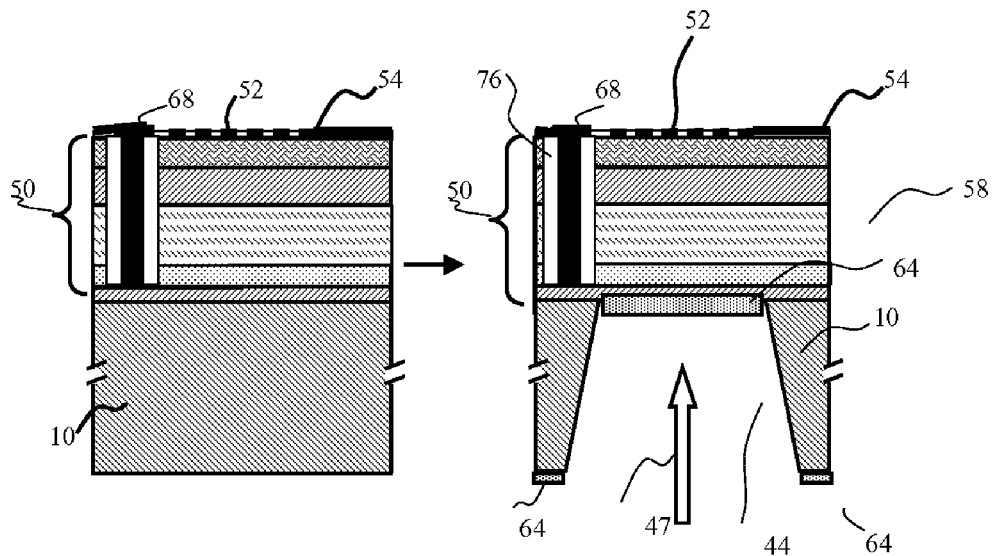
FIG. 18C  FIG. 18D
FIG. 18
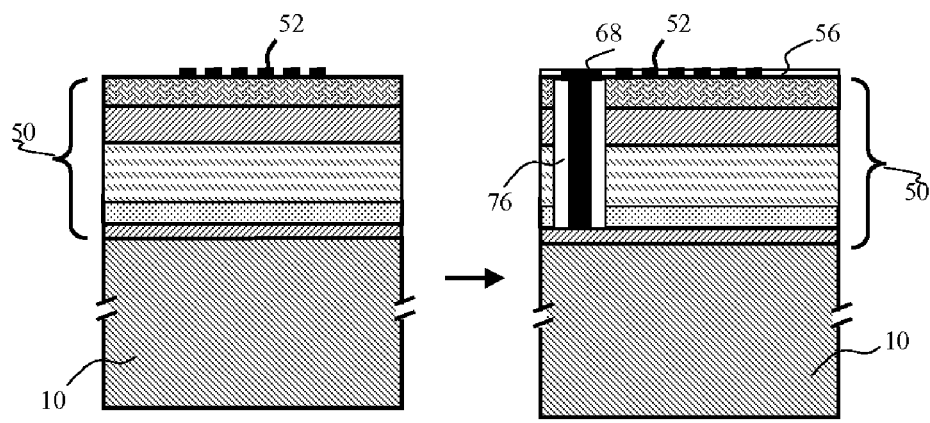
FIG. 19A  FIG. 19B
FIG. 19

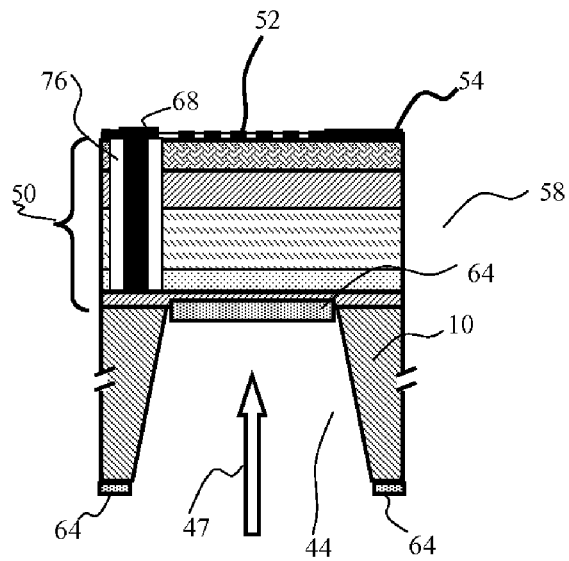
FIG. 19C
FIG. 19
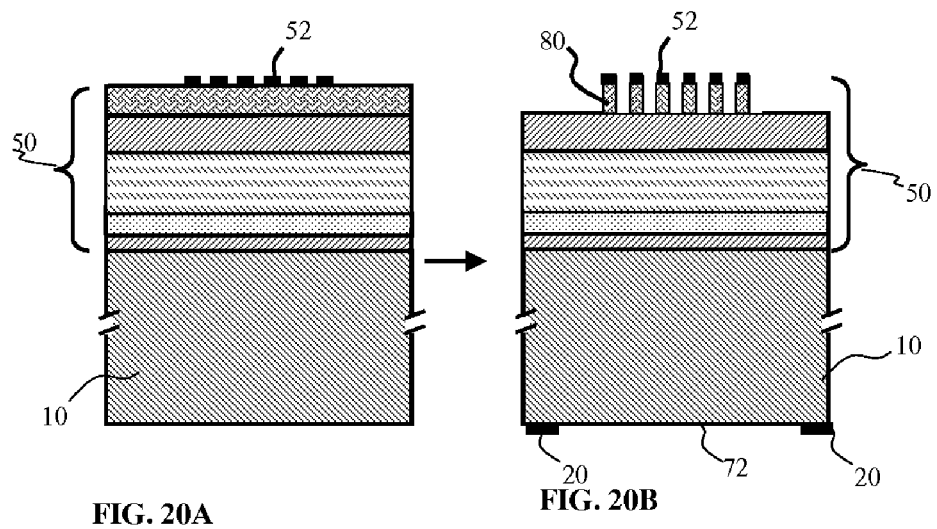
FIG. 20A   FIG. 20B
FIG. 20

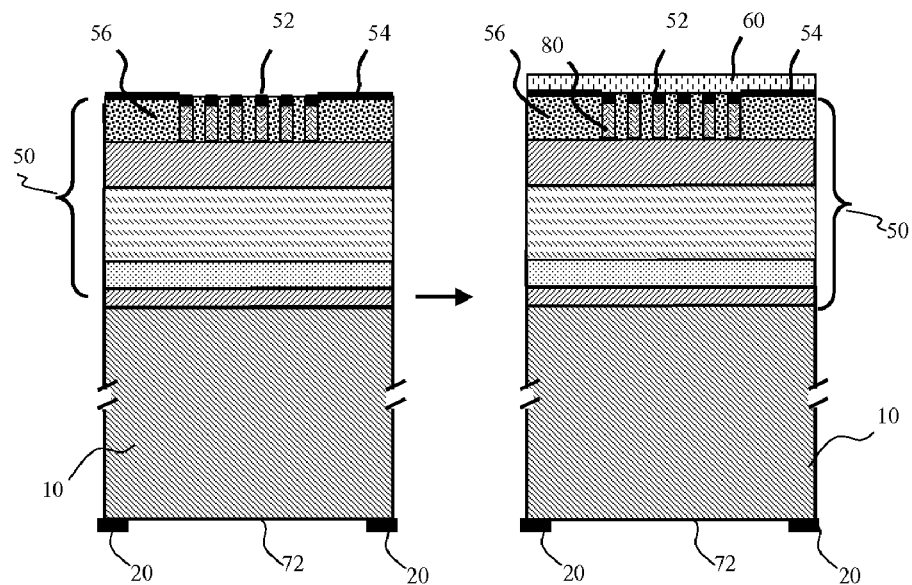
FIG. 20C  FIG. 20D
FIG. 20
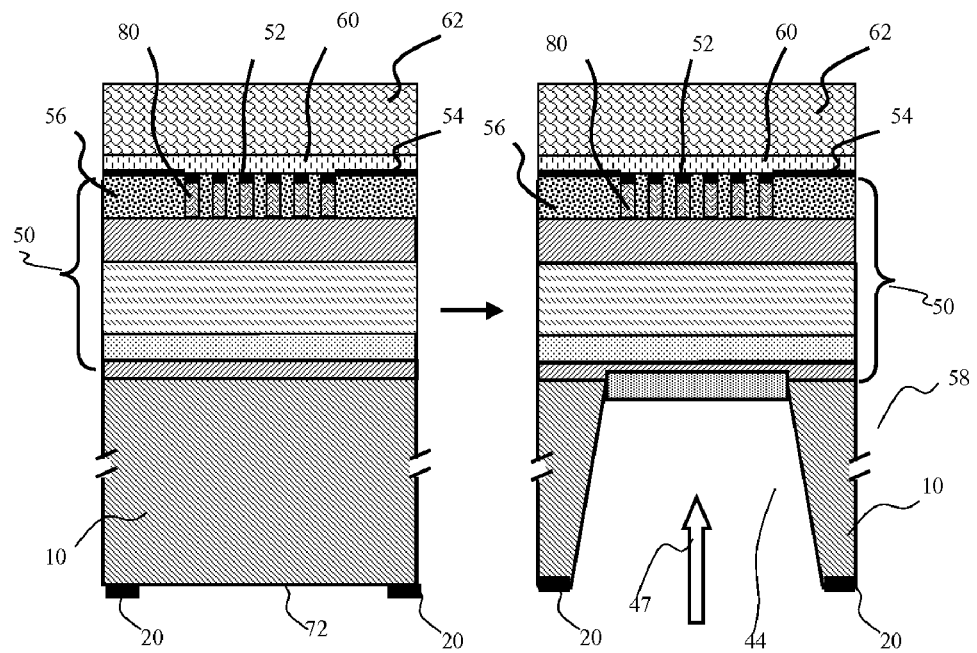
FIG. 20E  FIG. 20F
FIG. 20

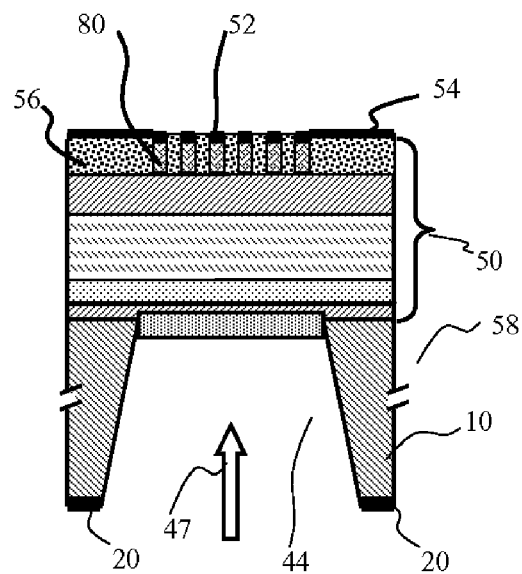
FIG. 21E
FIG. 21
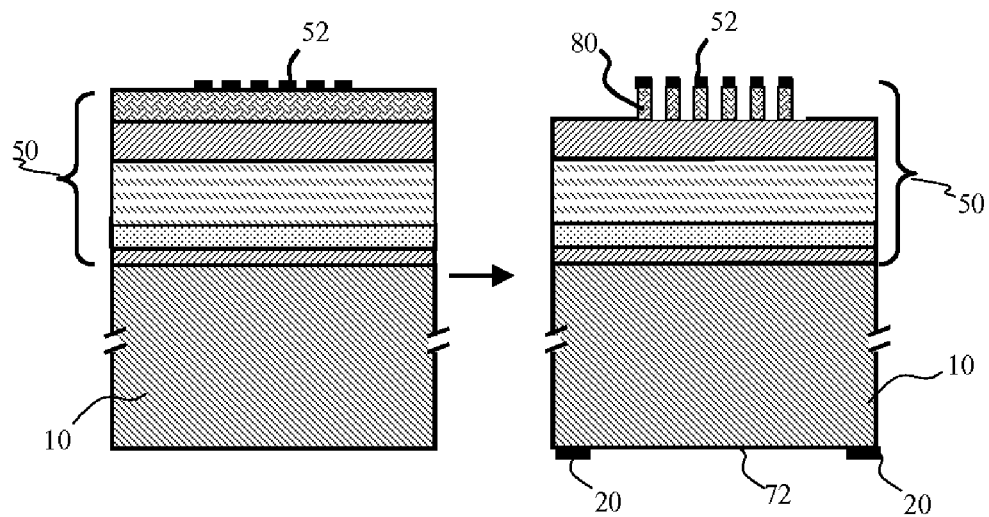
FIG. 22A  FIG. 22B
FIG. 22

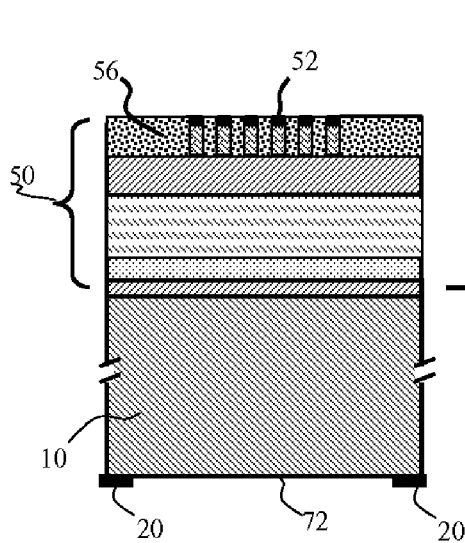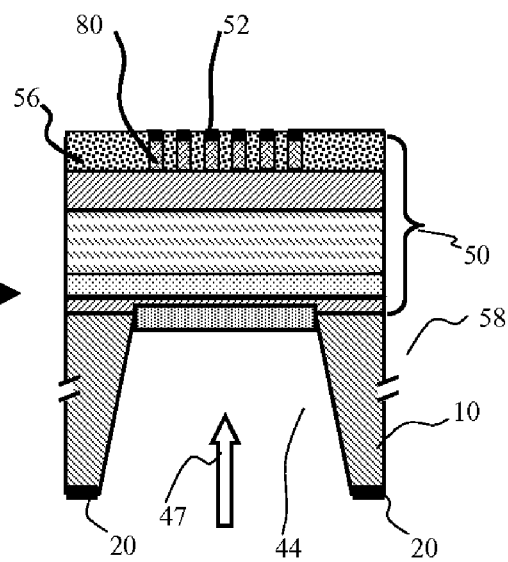
FIG. 22C  FIG. 22D
FIG. 22
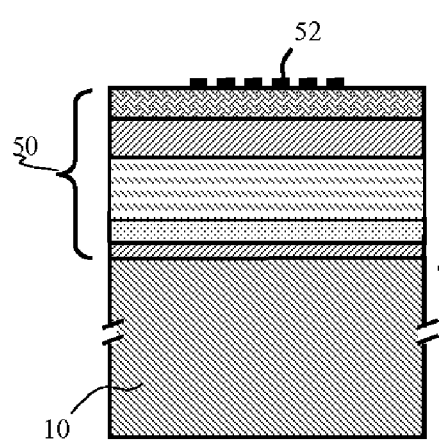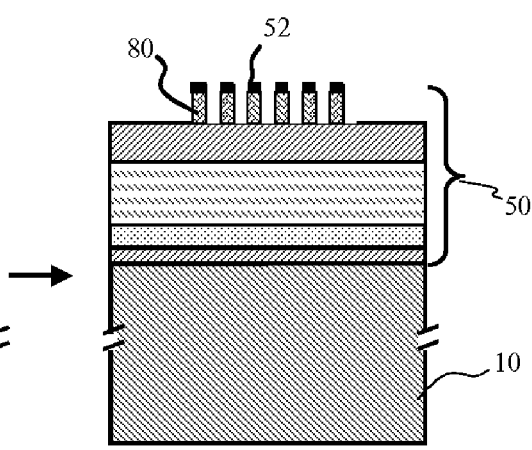
FIG. 23A  FIG. 23B
FIG. 23

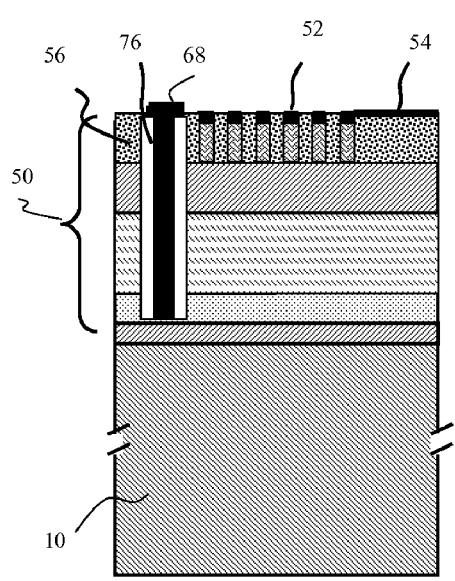
FIG. 23C
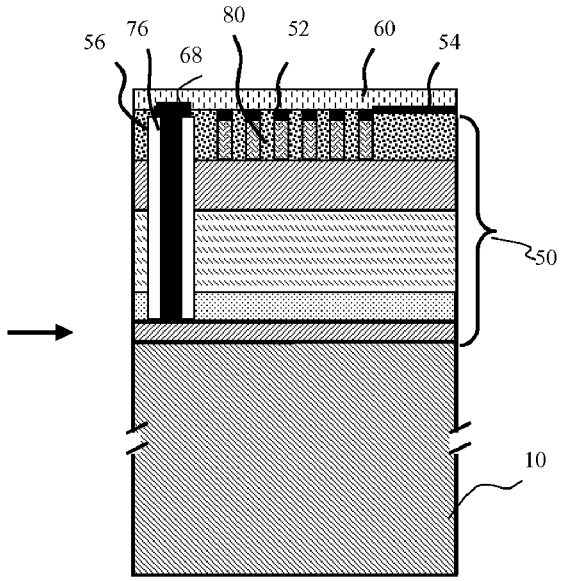
FIG. 23D
FIG. 23
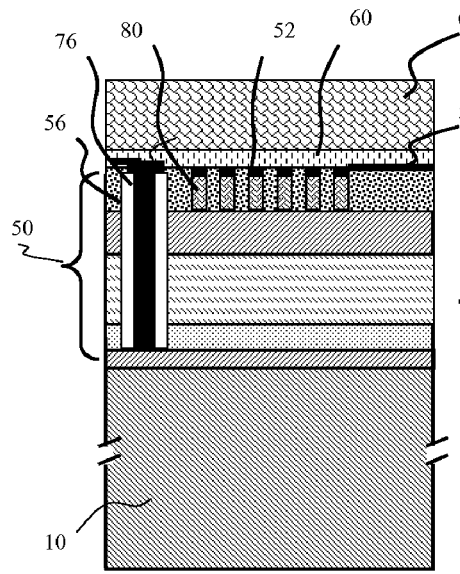
FIG. 23E
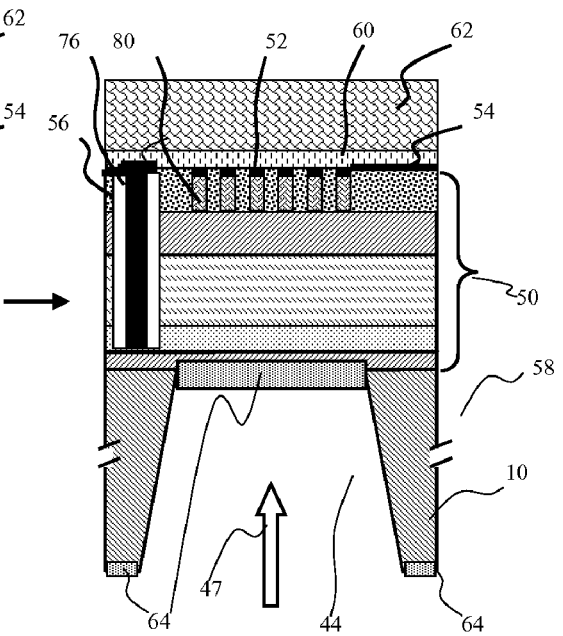
FIG. 23F
FIG. 23

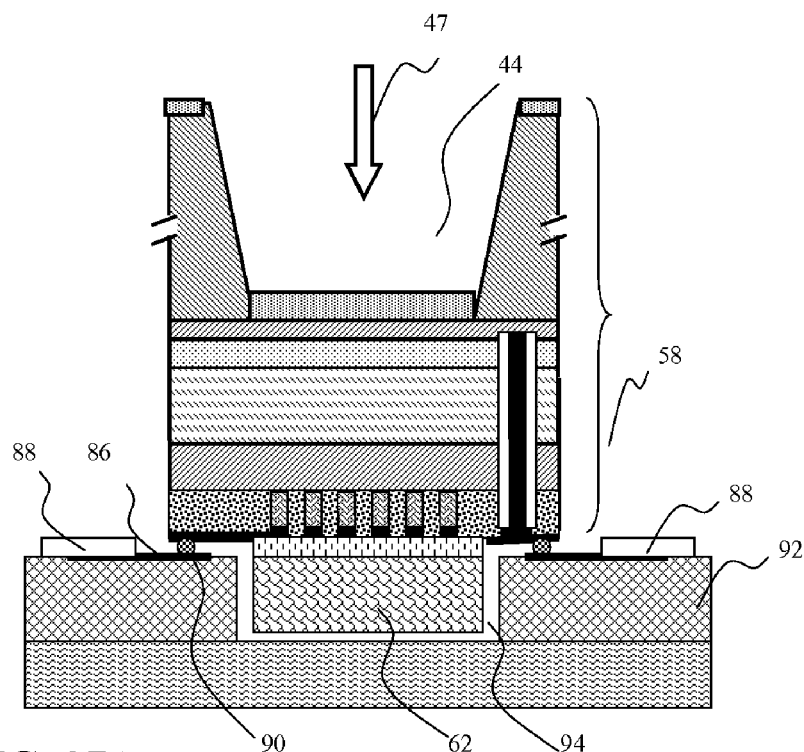
FIG. 27A
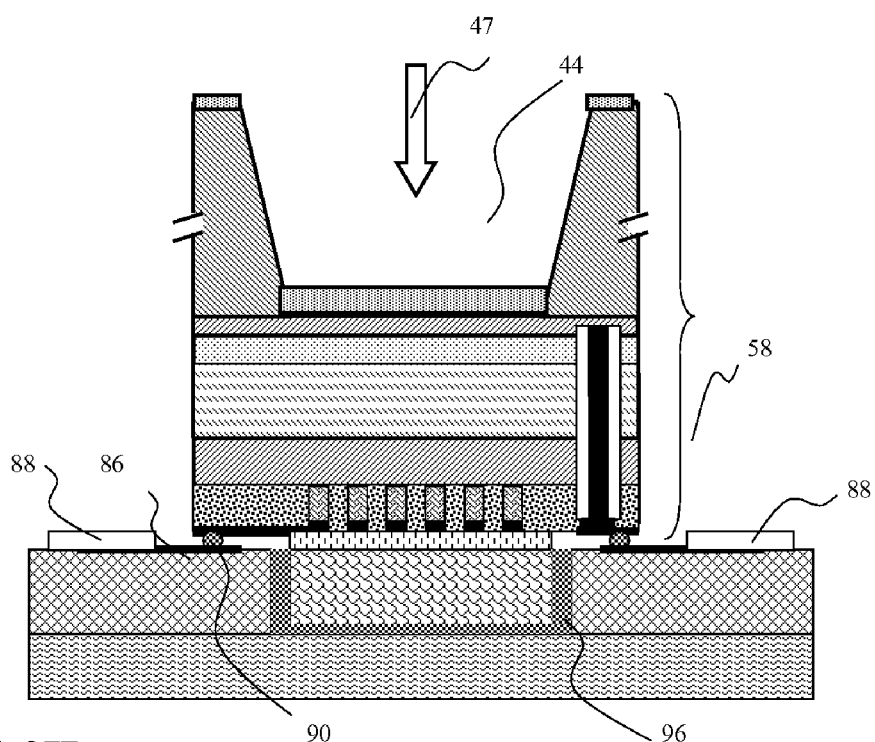
FIG. 27B
FIG. 27

MULTICOLOR PHOTODIODE ARRAY AND METHOD OF MANUFACTURING

This is a divisional of application(s) Ser. No. 11/162,523 filed on Sep. 13, 2005.

CROSS REFERENCE TO RELATED APPLICATIONS

This application claims the benefit of U.S. Provisional Patent Application 60/522,311 filed on Sep. 14, 2004.

FIELD OF THE INVENTION

This invention relates to optical detectors for broad spectral detection covering the wavelengths from ultra-violet (UV) to near infrared (1700 nm and also up to 2500 nm). More particularly, this invention is related to the multicolor detector, which can detect the light wavelengths ranging from as low as UV to the wavelengths as high as 1700 nm covering the most of the communication wavelength, and also from UV to as high as 2500 nm using the single monolithic detector fabricated on the single wafer. This invention is related to the multispectral photodetector arrays for multicolor imaging, sensing, and advanced communication.

BACKGROUND OF THE INVENTION

Solid-state imaging devices with higher resolutions are used in many commercial applications, especially in camera uses and also in other light imaging uses. Such imaging devices typically comprise of CCD (charge coupled device) photo detector arrays with associated switching elements, and address (scan) and read out (data) lines. This CCD technology has matured so much that now millions of pixels and surrounding circuitry can be fabricated using CMOS (complimentary metal oxide semiconductor) technology. Since today's CCD technology is based on silicon (Si)-technology, the detectable spectral ranges of CCD are limited to the wavelengths below 1 µm where Si exhibits absorption. Additionally, CCD based imaging techniques have other shortcomings such as an inability to achieve high efficiency response combined with high quantum efficiency over broad spectral ranges. This broad spectral detection is required in many applications. One of them is in free space laser communication where shorter (in visible ranges) and near infrared wavelengths are expected to be used. Photodiode arrays having broad spectral detection capabilities, disclosed in this invention, are expected to provide those features not available in today's CCD technology. With a well designed array, appreciable resolution can also be achieved in photodiode array technology.

Photodiodes, especially of p-i-n type, have been studied extensively over the last decade for their applications in optical communication. These photodiodes are for near infrared detection, especially the wavelengths in the vicinity of 1310 and 1550 nm, with which today's optical communication is dealt. Nowadays, photodetector speeds as high as 40 Gb/s, as described in the publication by Dutta et. al. in *IEEE Journal of Lightwave Technology*, vol. 20, pp. 2229-2238 (2002), are achieved. Photodetectors having a quantum efficiency close to 1, as described in the publication by Emsley et. al., in the *IEEE J. Selective Topics in Quantum Electronics*, vol. 8(4), pp. 948-955 (2002), are also available for optical communications. These photodiodes use InGaAs material as absorption material, and the diodes are fabricated on InP wafers. On the other hand, Si substrate is used for the photodiode to detect visible radiation.

For covering broad spectral ranges, two photodiodes, fabricated from Si and InP technology and discretely integrated, can be used. Monolithically, wafer bonding technology to bond Si and InP can be used to fabricated the photodiode covering the wavelengths from visible to near infrared. However, the reliability of wafer bonding over a wide range of temperatures is still an unsolved issue, and high-speed operation is not feasible with a wafer bonding approach. It is highly desirable to have a monolithic photodiode array, which could offer a high bandwidth (GHz and above) combined with high quantum efficiency over broad spectral ranges (less than 300 nm to 1700 nm and also less than 300 nm to 2500 nm). For use especially in imaging purposes, where CCD based devices are used, the photodiode array with the capability to rapidly and randomly address any pixel is also very much essential.

It is our objective to develop a monolithic photodiode array for broad spectral ranges covering wavelength detection from less than 300 nm to 1700 nm, while having a frequency response as high as 8 GHz and above bandwidth and a high quantum efficiency of over 90% over the entire wavelength region.

It is also our objective to develop a monolithic photodiode array (or single detector) for broad spectral ranges covering wavelength detection from less than 300 nm to 2500 nm, while having a frequency response as high as 8 GHz and above bandwidth and a high quantum efficiency of over 90% over the entire wavelength region.

Our innovative approach utilizes a surface incident type (either top or bottom emitting type) photodiode structure having a single set of absorption layers, which can provide broad spectral response. The absorption layers will be designed to achieve the required quantum efficiency and also the required speed. The photodiode can be used as a single element and also in an array form.

In an array form, especially for the case of a top-incident type photodetector, a metal line to connect each pixel separately to the outside contact pads is utilized for making it possible to rapidly and randomly address any pixel independently. As each metal line usually needs to connect outside pads to inside photodiode pixels, the pitch and element size is limited by the width of the metal line and array number. For example, the element size (i.e. photodiode pixel size) and pitch can be made to 5 µm and 10 µm, respectively, for the array size of 25×25 and metal line of 1 µm. For the bottom incident type of structure, a large number of pixels, even an array of over 1000×1000 photodiode elements can be possible.

According to the current invention, photodiodes having broad spectral ranges (less than 300 nm to 1700 nm and also less than 300 nm to 2500 nm), high quantum efficiency (greater than 90%), and high frequency response can be fabricated using the single wafer. According to this invention, in the case of the photodiode array, each array can be operated independently. The manufacturing thereof is also simpler as compared with the prior art. Some applications include multicolor imaging applications, such as for astronomical observation, communication, etc.

SUMMARY OF THE INVENTION

Accordingly, it is an objective of the invention to provide the structures of a single photodiode element which could have the broad spectral detections ranging from UV to near infrared. Two types of photodiodes structures are proposed: (a) one could cover from UV to 1700 nm, and (b) one could cover UV to 2500 nm.

It is also an objective that the structure of each photodiode element be able to provide high quantum efficiency over 90% over broad spectral detection ranges, and also high frequency response, as high as 8 GHz and more (@3 dB bandwidth). The structure is easy to fabricate using the standard photodiode fabrication process.

Another objective of this invention is to provide the photodiode array structure, which would have the broad spectral detection ranges, and each of its photodiode elements (hereafter mentioned as pixels) could be operated independently. This photodiode array has the CCD like feature in addition to the broad spectral detection capabilities. This array of high counts can be used for multicolor imaging purposes.

It is also an object of the invention to provide the top (also mentioned as the 'front')-illuminated type and bottom (also mentioned as the 'back')-type photodiode, which uses the structures having broad spectral detection capability as, mentioned previously.

Another objective of the present invention is to provide the material types to be used for achieving broader spectral detection ranges for photodiode. These materials are easy to deposit/grow using the standard IC technology.

Another objective of the invention is to use the InGaAs as the absorption layer for the photodiode having broad spectral detection ranges, covering from less than 300 nm to 1700 nm.

It is also an objective of the invention to use the InGaAs as the absorption layers for the photodiode having broad spectral detection ranges, covering from less than 300 nm to 2500 nm.

It is also an objective of the invention to use the InP or GaAs wafer for fabricating the photodiode having broad spectral ranges.

Another objective of the present invention is to provide the fabrication process to fabricate the single photodiode and its array using the standard IC fabrication process.

According to the invention, the single photodiode covering less than 300 nm to 1700 nm, comprises,
(i) an ohmic contact layer;
(ii) a substrate;
(iii) a first highly doped buffer layer, material-type same as the substrate;
(iv) at least one intrinsic layer of InGaAs for absorption layer, fabricated on the top of the first doped layer;
(v) at least one layer of second doped or lightly doped InGaAs type, or etch stopper layer on the top of absorption layer;
(vi) an incident surface area opened on the thin recessed layer;
(vii) at least one doped second layer surrounding incident surface for the contact layer, and;
(viii) a second ohmic metal contact layer on the top of the thick-doped layer,
wherein the light incident surface (opening area) could be circular, rectangular or square shaped, and they are designed to be able to have the field distribution enough to avoid the diffusion related current.

To avoid large resistance due to the abrupt junction formation, gradual doping can be used in between the intrinsic absorption layer and the second highly doped layer. A thin spacer layer of second type can be used in between the second highly doped layer and the intrinsic layer.

According to the invention, the single photodiode covering less than 300 nm to 2500 nm, comprises,
(i) an ohmic contact layer;
(ii) a substrate;
(iii) at least one first highly doped buffer layer, of material-type same as the substrate;
(iv) at least one layer of $InAs_yP_{1-y}$ type material of variable y, where y is <1 but >0;
(v) an intrinsic or lightly doped layer of InGaAs for absorption layer, fabricated on the top of the single layer or plurality of layers of $InAs_yP_{1-y}$ type material;
(vi) at least one layer of second highly doped and/or lightly doped InGaAs type as a recessed layer or a thin layer of the etch stopper layer on the top of absorption layer;
(vii) an incident surface area opened on the thin recessed layer;
(viii) at least one highly doped second layer of InGaAs type for the contact layer, surrounding the incident surface of the recessed layer, and;
(ix) a second ohmic metal contact layer on the top of the thick doped layer;
wherein the light incident surface (opening area) could be the circular, rectangular or square shaped, and they are designed able to have the field distribution enough avoiding the diffusion related current.

To avoid large resistance due to the abrupt junction formation, gradual doping can be used in between the intrinsic absorption layer and the second highly doped layer. A thin spacer layer of second type can be used in between the second highly doped layer and the intrinsic layer.

Alternately, a graded layer can be incorporated in the structure to reduce the minority carrier trapping at the InAsP/InGaAs band edge discontinuity.

According to the invention, the photodiode array comprises:
(i) an M×N array of photodiode elements, wherein each photodiode element (having broad spectral ranges of less than 300 nm to 1700 nm), comprises,
  (a) an ohmic contact layer;
  (b) a substrate;
  (c) at least one first highly doped buffer layer, of material-type same as the substrate;
  (d) an intrinsic layer of InGaAs for the absorption layer, fabricated on the top of the first doped layer;
  (e) at least one layer of second doped or lightly doped InGaAs type, or etch stopper layer on the top of the absorption layer;
  (f) an incident surface area opened on the thin recessed layer;
  (g) at least one doped second layer for the contact layer, surrounding the incident surface of the recessed layer, and;
  (h) a second ohmic metal contact layer on the top of the thick doped layer;
    wherein the light incident surface (opening area) of each photodiode element could be the circular, rectangular, or square shaped, and they are designed able to have the field distribution enough avoiding the diffusion related current;
(ii) at least one interconnection metal line connecting each photodiode to the outside pad, wherein each photodiode is independently addressable, and;
(iii) a common ohmic metal contact layer on the backside of the substrate for all photodiodes in the array.

According to the invention, the photodiode array comprises:
(i) M×N photodiodes, wherein each photodiode (having broad spectral ranges of less than 300 nm to 1700 nm), comprises
  (a) an ohmic contact layer;
  (b) a substrate;

(c) at least one layer of first highly doped buffer layer, of material-type same as the substrate;
(d) an intrinsic layer of InGaAs for the absorption layer, fabricated on the top of the first doped layer;
(e) at least one layer of second doped or lightly doped InGaAs type, or etch stopper layer on the top of absorption layer;
(f) an incident surface area opened on the thin recessed layer;
(g) at least one layer of doped second layer for the contact layer, surrounding incident surface of the recessed layer, and;
(h) second ohmic metal contact layer on the top of the thick doped layer;
wherein the light incident surface (opening area) of each photodiode element could be circular, rectangular or square shaped, and they are designed able to have the field distribution enough to avoid the diffusion related current;
(ii) an interconnection metal line connecting the photodiodes in a way that only one photodiode signal located in the same row and column can be taken out, and
(iii) a common ohmic metal contact layer on the backside of the substrate for all photodiodes in the array.

According to the invention, the photodiode array comprises:
(i) an M×N array of photodiode elements, wherein each photodiode element (having broad spectral ranges of less than 300 nm to 2500 nm), comprises,
(a) an ohmic contact layer;
(b) a substrate;
(c) at least one layer of highly doped buffer layer, of material-type same as the substrate;
(d) a single layer or plurality of layers of $InAs_yP_{1-y}$ type material of variable y, where y is <1 but >0;
(e) an intrinsic or lightly doped layer of InGaAs for the absorption layer fabricated on the top of the singular or plurality layers of $InAs_yP_{1-y}$ type material;
(f) at least one layer of second highly doped and/or lightly doped InGaAs type as a recessed layer or a thin layer of the etch stopper layer on the top of absorption layer;
(g) an incident surface area opened on the thin recessed layer;
(h) at least one layer of highly doped second layer of InGaAs type for the contact layer, surrounding the incident surface of the recessed layer, and;
(i) a second ohmic metal contact layer on the top of the thick-doped layer;
wherein the light incident surface (opening area) of each photodiode element could be circular, rectangular or square shaped, and they are designed able to have the field distribution enough avoiding the diffusion related current;
(ii) an interconnection metal line connecting each photodiode to the outside pad, wherein each photodiode is independently addressable, and;
(iii) a common ohmic metal contact layer on the backside of the substrate for all photodiodes in the array.

According to the invention, the photodiode array comprises:
(i) M×N photodiodes, wherein each photodiode (having broad spectral ranges of less than 300 nm to 2500 nm), comprises,
(a) an ohmic contact layer;
(b) a substrate;
(c) at least one first highly doped buffer layer, of material-type same as the substrate;
(d) at least one layer of $InAs_yP_{1-y}$ type material of variable y, where y is <1 but >0;
(e) an intrinsic or lightly doped layer of InGaAs for the absorption layer fabricated on the top of the single layer or plurality of layers of $InAs_yP_{1-y}$ type material;
(f) at least one layer of second highly doped and/or lightly doped InGaAs type as recessed layer or a thin layer of the etch stopper layer on the top of absorption layer;
(g) an incident surface area opened on the thin recessed layer;
(h) a least one layer of highly doped second layer of InGaAs type for the contact layer, surrounding the incident surface of the recessed layer, and;
(i) a second ohmic metal contact layer on the top of the thick doped layer;
wherein the light incident surface (opening area) of each photodiode element could be circular, rectangular or square shaped, and they are designed able to have the field distribution enough avoiding the diffusion related current;
(ii) an interconnection metal line connecting the photodiodes in a way that only one photodiode signal located in the same row and column can be taken out at a time, and;
(iii) a common ohmic metal contact layer on the backside of the substrate for all photodiodes in the array.

It is also an objective of this invention to provide the interconnection scheme with metal connection connecting each photodiode element to the outside pad, and this can be designed in a way that metal contacts of the photodiodes located on one-fourth of the array are designed to align in two sides. Replica of this metal layout can be copied for metal contact alignment for other photodiodes located on three-fourths of the array.

According to the invention, the fabrication process of the photodiode comprises,
(i) growing the layers forming the photodiode structure on the substrate;
(ii) patterning and dry etching the second high doped layer to open the incident surface and keep the thin recessed layer of the second highly doped layer;
(iii) forming of the top ohmic contact;
(iv) forming of the AR coating on the opened surface, and;
(v) polishing the substrate and forming of the bottom ohmic contact,
wherein the recessed layer of the second highly doped layer is left on the top of the incident layer to distribute the electrical field on the incident surface.

According to the invention, the fabrication process of the photodiode comprises,
(i) growing the layers forming the photodiode structure on the substrate;
(i) patterning and forming of the top ohmic contact;
(ii) etching the portion of the second highly doped layer to open the incident surface and keep the thin recessed layer of the second highly doped layer;
(iii) forming of the AR coating on the opened surface, and;
(iv) polishing the substrate and forming of the bottom ohmic contact,
wherein the thin recessed layer of the second highly doped layer is on the top of the incident layer to distribute the electrical field on the incident surface.

According to the invention, the fabrication process of the photodiode array comprises:

(i) growing the layers forming the photodiode structure on the substrate;
(ii) patterning and dry etching the portion of the second highly doped layer to open the incident surface, and keep the thin recessed layer of second highly doped layer on the incident surface;
(iii) patterning and forming of the top ohmic contact;
(v) depositing the step coverage layer and planarization;
(vi) patterning and forming the metal contact connecting the photodiode's top contact to the outside pad;
(vii) patterning and etching out the dielectric portion from the incident surface,
(viii) depositing the passivation layer as the AR coat on the incident surface, and;
(ix) forming the common ohmic contact at the backside of the substrate.

According to this invention, the antireflection (AR) coating layer is to be compatible for the wavelength ranges to be detected to reduce the reflection loss. This AR coating could be the single layer or multilayer combinations.

Alternatively, according to the invention, the fabrication process of the photodiode array comprises:
(i) growing the layers forming the photodiode structure on the substrate;
(ii) patterning and depositing the top metal and forming the ohmic contact;
(iii) etching (dry or wet) the portion of the second highly doped layer to open the incident surface and keep the thin recessed layer of second highly doped layer on the incident surface;
(iv) depositing the step coverage layer and planarization;
(v) patterning and forming the metal contact connecting the photodiode's top contact to the outside pad;
(vi) patterning and etching out the dielectric portion from the incident surface,
(vii) depositing of the passivation layer as the AR coat on the incident surface, and;
(viii) forming the common ohmic contact at the backside of the substrate.

According to this invention, the antireflection (AR) coating layer is to be compatible for the wavelength ranges to be detected to reduce the reflection loss. This AR coating could be the single layer or multilayer combinations.

According to the invention, the fabrication process of the photodiode array comprises:
(i) growing the layers forming the photodiode structure on the substrate;
(ii) patterning and dry etching the portion of the second highly doped layer to open the incident surface and keep the thin recessed layer of second highly doped layer on the incident surface;
(iii) patterning and forming the top ohmic contact;
(iv) patterning and dry etching up to the substrate surface outside of each photodiode to isolate each photodiode;
(v) depositing the step coverage layer and planarization;
(vi) patterning and forming the metal contact connecting the photodiode's top contact to the outside pad;
(vii) patterning and etching out the dielectric portion from the incident surface,
(viii) depositing the passivation layer as the AR coat on the incident surface, and;
(ix) forming the common ohmic contact at the backside of the substrate.

According to this invention, the antireflection (AR) coating layer is to be compatible for the wavelength ranges to be detected to reduce the reflection loss. This AR coating could be the single layer or multilayer combinations.

Alternatively, according to the invention, the fabrication process of the photodiode array comprises:
(i) growing the layers forming the photodiode structure on the substrate;
(ii) patterning and depositing the top metal and forming the ohmic contact;
(iii) etching (dry or wet) the portion of the second highly doped layer to open the incident surface and keep the thin recessed layer of second highly doped layer on the incident surface;
(iv) patterning and dry etching up to the substrate surface outside of each photodiode to isolate each photodiode;
(v) depositing the step coverage layer and planarization;
(vi) patterning and forming the metal contact connecting the photodiode's top contact to the outside pad;
(vii) patterning and etching out the dielectric portion from the incident surface,
(viii) depositing the passivation layer as the AR coat on the incident surface, and;
(x) forming the common ohmic contact at the backside of the substrate.

According to this invention, the antireflection (AR) coating layer is to be compatible for the wavelength ranges to be detected to reduce the reflection loss. This AR coating could be the single layer or multilayer combinations.

According to the invention, the single photodiode covering less than 300 nm to 1700 nm, comprises,
(i) an ohmic contact layer on the substrate;
(ii) a backside etching of the substrate to open the incident area;
(iii) an AR coating;
(iv) a single or plurality of highly doped thin layers of InP or InGaAs;
(v) at least one intrinsic layer of InGaAs as an absorption layer, fabricated on the top of the first doped layer;
(vi) at least one layer of second doped or lightly doped InGaAs type on the top of the absorption layer;
(vii) at least one layer of highly doped InP or InGaAs layer on the top of the lightly doped layer, and;
(viii) a top ohmic contact wherein the light incident surface (opening area at the back side of the substrate) could be the circular, rectangular or square shaped. The opening area along with the thickness of thin layer of highly doped InP or InGaAs are designed to have the field distribution enough avoiding the diffusion related current.

According to this invention, in order to avoid the large resistance due to the abrupt junction formation, gradual doping can be used in between the intrinsic absorption layer and the second highly doped InP or InGaAs layer. A thin layer of spacer layer of InP or InGaAs type can be used in between the second highly doped InP or InGaAs layer and InGaAs absorption layer.

Alternatively, according to the invention, the single photodiode covering less than 300 nm to 1700 nm, comprises,
(i) a backside etching of the substrate to open the incident area;
(ii) an AR coating
(iii) a single or plurality of highly doped thin layers of InP or InGaAs;
(iv) at least one intrinsic layer of InGaAs as an absorption layer, fabricated on the top of the first doped layer;
(v) at least one layer of second doped or lightly doped InGaAs type on the top of the absorption layer;
(vi) at least one thick layer of highly doped InP or InGaAs layer on the top of the lightly doped layer;
(vii) an ohmic contact on the top, and;

(viii) an ohmic contact made with the highly doped layer or substrate after etching out the layers;

wherein the light incident surface (opening area at the back side of the substrate) could be circular, rectangular or square shaped. The opening area along with the thickness of thin layer of highly doped InP or InGaAs are designed to have the field distribution enough avoiding the diffusion related current.

According to this invention, in order to avoid the large resistance due to the abrupt junction formation, gradual doping can be used in between the intrinsic absorption layer and the second highly doped InP or InGaAs layer. A thin layer of spacer layer of InP or InGaAs type can be used in between the second highly doped InP or InGaAs layer and InGaAs absorption layer.

According to the invention, the photodiode array comprises:
- (i) an M×N array of photodiode elements, wherein each photodiode element (having broad spectral ranges of less than 300 nm to 1700 nm), comprises,
  - (a) a common ohmic contact layer;
  - (b) a backside etched InP substrate;
  - (c) a single layer or plurality of layers of highly doped buffer layers;
  - (d) an intrinsic layer of InGaAs as an absorption layer, fabricated on the top of the first doped layer;
  - (e) at least one layer of lightly doped InGaAs or InP type on the top of the absorption layer;
  - (f) at least one layer of doped InGaAs or InP layer, and;
  - (g) a second ohmic metal contact layer on the top of the thick doped layer;
- (ii) at least one dielectric layer isolating each photodiode element;
- (iii) an interconnection metal line connecting each photodiode to the outside pad, wherein each photodiode is independently addressable;
- (iv) a planarized dielectric or epoxy layer, and;
- (v) at least one substrate of dielectric or semiconductor.

According to the invention, the photodiode array comprises:
- (i) an M×N array of photodiode elements, wherein each photodiode element (having broad spectral ranges of less than 300 nm to 1700 nm), comprises,
  - (a) a common ohmic contact layer;
  - (b) a backside etched InP or GaAs substrate;
  - (c) a single layer or plurality of layers of highly doped buffer layers;
  - (d) at least one intrinsic layer of InGaAs as an absorption layer, fabricated on the top of the first doped layer;
  - (e) at least one layer of lightly doped InGaAs or InP type on the top of absorption layer;
  - (f) at least one doped InGaAs or InP layer, and;
  - (e) a second ohmic metal contact layer on the top of the thick doped layer;
- (ii) at least one dielectric layer isolating each photodiode element;
- (iii) an interconnection metal line connecting the photodiodes in a way that only one photodiode signal located in the same row and column can be taken out at a time;
- (iv) a planarized dielectric or epoxy layer, and;
- (v) at least one substrate of dielectric or semiconductor.

According to the invention, the photodiode array comprises:
- (i) an N×N array of photodiode elements, wherein each photodiode element (having broad spectral ranges of less than 300 nm to 1700 nm), comprises,
  - (a) a common ohmic contact layer;
  - (b) a backside etched InP substrate;
  - (c) a single layer or plurality of layers of highly doped buffer layers;
  - (d) at least one intrinsic layer of InGaAs as an absorption layer, fabricated on the top of the first doped layer;
  - (e) at least of one layer of lightly doped InGaAs or InP type on the top of the absorption layer;
  - (f) at least one layer of doped InGaAs or InP layer, and;
  - (g) second ohmic metal contact layer on the top of the thick doped layer;
- (ii) a dielectric layer isolating the each photodiode element, and;
- (iii) an interconnection metal line connecting each photodiode to the outside pad, wherein each photodiode is independently addressable.

Alternatively, according to the invention, the photodiode array comprises:
- (i) an N×N array of photodiode elements, wherein each photodiode element (having broad spectral ranges of less than 300 nm to 1700 nm), comprises,
  - (a) a common ohmic contact layer;
  - (b) at least one etched portion in backside of a semiconductor substrate;
  - (c) a single layer or plurality of layers of highly doped buffer layers;
  - (d) at least one intrinsic layer of InGaAs as an absorption layer, fabricated on the top of the first doped layer;
  - (e) a least one layer of lightly doped InGaAs or InP type on the top of the absorption layer;
  - (f) at least one layer of doped InGaAs or InP layer, and;
  - (g) second ohmic metal contact layer on the top of the thick doped layer;
- (ii) a dielectric layer isolating each photodiode element, and;
- (iii) an interconnection metal line connecting the photodiodes in a way that only one photodiode signal located in the same row and column can be taken out at a time.

Alternatively, according to the invention, the photodiode array comprises:
- (i) an M×N array of photodiode elements, wherein each photodiode element (having broad spectral ranges of less than 300 nm to 1700 nm), comprises,
  - (a) a common ohmic contact layer;
  - (b) at least one etched portion of backside of semiconductor substrate;
  - (c) a single or plurality of highly doped buffer layers;
  - (d) at least one intrinsic layer of InGaAs as an absorption layer, fabricated on the top of the first doped layer;
  - (e) at least one layer of lightly doped InGaAs or InP type on the top of the absorption layer;
  - (f) at least one layer of doped InGaAs or InP layer, and;
  - (g) a second ohmic metal contact layer on the top of the thick doped layer, and;
- (ii) a dielectric layer isolating each photodiode element.

wherein the interconnection of each photodiode element to the outside can be done by turning upside down the whole array structure and bonding each photodiode element to the metal pads located on the different substrate. The light is incident from the backside of the etched substrate.

According to the invention, the photodiode array comprises:
- (i) an M×N array of photodiode elements, wherein each photodiode element (having broad spectral ranges of less than 300 nm to 1700 nm), comprises,
  - (a) a common ohmic contact layer;
  - (b) at least one etched portion in backside of a semiconductor substrate;

(c) a single or plurality of highly doped buffer layers;
(d) an intrinsic layer of InGaAs as an absorption layer, fabricated on the top of the first doped layer;
(e) at least one layer of lightly doped InGaAs or InP type on the top of absorption layer;
(f) at least one layer of doped InGaAs or InP layer which is etched up to the top of the lightly doped or non-doped InP or InGaAs layer to isolate each photodiode element, and;
(g) a second ohmic metal contact layer on the top of the doped layer;
(iii) a dielectric layer isolating the each photodiode element;
(iv) an interconnection metal line connecting each photodiode to the outside pad, wherein each photodiode is independently addressable;
(v) a planarized dielectric or epoxy layer, and;
(vi) a substrate of dielectric or semiconductor bonded on the top of the planarized dielectric or epoxy layer.

According to the invention, the photodiode array comprises:
(i) an N×N array of photodiode elements, wherein each photodiode element (having broad spectral ranges of less than 300 nm to 1700 nm), comprises,
   (a) a common ohmic contact layer;
   (b) at least one etched portion in backside of InP substrate;
   (c) a single or plurality of highly doped buffer layers;
   (d) at least one intrinsic layer of InGaAs as an absorption layer, fabricated on the top of the first doped layer;
   (e) at least one layer of lightly doped InGaAs or InP type on the top of the absorption layer;
   (f) at least one layer of doped InGaAs or InP layer which is etched up to the top of the lightly doped or non-doped InP or InGaAs layer to isolate each photodiode element, and;
   (g) a second ohmic metal contact layer on the top of the doped layer;
(ii) a dielectric layer isolating each photodiode element;
(iii) at least one interconnection metal line connecting the photodiodes in a way that only one photodiode signal located in the same row and column can be taken out at a time;
(iv) a planarized dielectric or epoxy layer, and;
(v) at least one substrate of dielectric or semiconductor.

According to the invention, the photodiode array comprises:
(i) an M×N array of photodiode elements, wherein each photodiode element (having broad spectral ranges of less than 300 nm to 1700 nm), comprises,
   (a) a common ohmic contact layer;
   (b) at least one etched portion in backside of InP substrate;
   (c) a single or plurality of highly doped buffer layers;
   (d) at least one intrinsic layer of InGaAs as an absorption layer, fabricated on the top of the first doped layer;
   (e) At least one layer of lightly doped InGaAs or InP type on the top of the absorption layer;
   (f) at least one layer of doped InGaAs or InP layer which is etched up to the top of the lightly doped or non-doped InP or InGaAs layer to isolate each photodiode element, and;
   (g) a second ohmic metal contact layer on the top of the doped layer;
(ii) a dielectric layer isolating the each photodiode element, and;
(iii) at least one interconnection metal line connecting each photodiode to the outside pad, wherein each photodiode is independently addressable.

Alternatively, according to the invention, the photodiode array comprises:
(i) an M×N array of photodiode elements, wherein each photodiode element (having broad spectral ranges of less than 300 nm to 1700 nm), comprises,
   (a) a common ohmic contact layer;
   (b) at least one etched portion in backside of InP substrate;
   (c) a single or plurality of highly doped buffer layers;
   (d) at least intrinsic layer of InGaAs as an absorption layer, fabricated on the top of the first doped layer;
   (e) at least one layer of lightly doped InGaAs or InP type on the top of the absorption layer;
   (f) at least one layer of doped InGaAs or InP layer which is etched up to the top of the lightly doped or non-doped InP or InGaAs layer to isolate each photodiode element, and;
   (g) a second ohmic metal contact layer on the top of the doped layer;
(ii) a dielectric layer isolating each photodiode element, and;
(iii) at least one interconnection metal line connecting the photodiodes in a way that only one photodiode signal located in the same row and column can be taken out.

Alternatively, according to the invention, the photodiode array comprises:
(i) an M×N array of photodiode elements, wherein each photodiode element (having broad spectral ranges of less than 300 nm to 1700 nm), comprises,
   (a) a common ohmic contact layer;
   (b) at least one etched portion in backside of InP substrate;
   (c) a single or plurality of highly doped buffer layers;
   (d) at least one intrinsic layer of InGaAs as an absorption layer, fabricated on the top of the first doped layer;
   (e) at least one layer of lightly doped InGaAs or InP type on the top of the absorption layer;
   (f) at least one layer of doped InGaAs or InP layer which is etched up to the top of the lightly doped or non-doped InP or InGaAs layer to isolate each photodiode element, and;
   (g) a second ohmic metal contact layer on the top of the doped layer;
(ii) a dielectric layer isolating each photodiode element.
wherein the interconnection of each photodiode element to the outside can be done by turning upside down the whole array structure and bonding each photodiode element to the metal pads located on the independent substrate. The light is incident from the backside of the etched substrate.

According to the invention, AR coating is also used on the top of the thin high doped InP or InGaAs after etching the bottom side of the InP substrate.

According to the invention, the photodiode array comprises:
(i) an N×N array of photodiode elements, wherein each photodiode element (having broad spectral ranges of less than 300 nm to 1700 nm), comprises,
   (a) a backside etched InP substrate;
   (b) a single or plurality of highly doped layers of InP or InGaAs;
   (c) at least one intrinsic layer of InGaAs as an absorption layer, fabricated on the top of the first doped layer;
   (d) at least one layer of lightly doped InGaAs or InP type on the top of the absorption layer;

(e) at least one layer of doped InGaAs or InP layer,
(f) a first ohmic contact on the top of the highly doped thick layer,
(g) a dielectric to isolate the second, and;
(h) a common second ohmic contact made with the highly doped InP (or InGaAs) layer or InP substrate after etching out the layers;
(ii) at least one dielectric layer isolating each photodiode element;
(iii) at least one interconnection metal line connecting each photodiode to the outside pad, wherein each photodiode is independently addressable;
(iv) a planarized dielectric or epoxy layer, and;
(v) at least one substrate of dielectric or semiconductor.

Alternatively, according to the invention, the photodiode array comprises:
(i) an N×N array of photodiode elements, wherein each photodiode element (having broad spectral ranges of less than 300 nm to 1700 nm), comprises,
(a) at least one etched portion in backside of InP substrate;
(b) a single or plurality of highly doped layers of InP or InGaAs;
(c) at least one intrinsic layer of InGaAs as an absorption layer, fabricated on the top of the first doped layer;
(d) at least one layer of lightly doped InGaAs or InP type on the top of the absorption layer;
(e) at least one layer of doped InGaAs or InP layer;
(f) a first ohmic contact on the top of the highly doped thick layer;
(g) a dielectric layer, and;
(h) a common second ohmic contact made at the highly doped InP (or InGaAs) layer or InP substrate after etching out the layers, and;
(ii) a planarized dielectric layer isolating each photodiode element;

wherein the interconnection of each photodiode element to the outside can be done by turning upside down the whole array structure and bonding each photodiode element to the metal pads located on the independent substrate. The light is incident from the backside of the etched substrate.

According to the invention, AR coating is also used on the top of the thin high doped InP or InGaAs after etching the bottom side of the InP substrate.

According to the invention, the fabrication process of the photodiode comprises,
i) growing the layers forming the photodiode structure on the substrate;
(ii) patterning and forming the top ohmic contact;
(iii) patterning and forming the bottom electrode outside the incident area;
(iv) etching the bottom of the substrate to create the incident area, and;
(v) depositing the AR coating on the incident surface.

According to the invention, the fabrication process of the photodiode comprises,
(i) growing the layers forming the photodiode structure on the substrate;
(ii) depositing the dielectric layer on the bottom side of the substrate;
(iii) patterning and etching out the dielectric portion from the bottom side to create the incident area;
(iv) patterning and forming the top ohmic contact;
(v) patterning and etching to make a hole from top to the first highly doped layer or up to the substrate;
(vi) forming the dielectric layer;
(vii) patterning and etching the dielectric layer outside the etched hole;
(viii) metallization and formation of the bottom electrode which is connected from the top;
(ix) etching the bottom of the substrate to create the incident area, and;
(x) deposition of the AR coating on the incident surface.

According to the invention, the fabrication process of the photodiode array of N×N photodiode elements, comprises,
(i) growing the layers forming the photodiode structure on the substrate;
(ii) patterning and formation of the top ohmic contacts of N×N elements;
(iii) deposition of the dielectric layer and planarization;
(iv) metallization at the backside of the substrate;
(v) patterning and etch out the metal portion from the incident surface;
(vi) formation of bottom common ohmic contacts at the backside of the substrate;
(vii) patterning and formation of metal lines connecting photodiode's top contact to the outside pad;
(viii) formation of dielectric or epoxy layer;
(ix) attachment of the quartz or semiconductor on the dielectric or epoxy layer;
(x) etching out the backside of the substrate to open the incident area, and;
(xi) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array of N×N photodiode elements, comprises,
(i) growing the layers forming the photodiode structure on the substrate;
(ii) patterning and formation of the top ohmic contacts of N×N;
(iii) deposition of the dielectric layer and planarization;
(iv) metallization at the backside of the substrate;
(v) patterning and etch out the metal portion from the incident surface;
(vi) formation of bottom common ohmic contacts at the backside of the substrate;
(vii) patterning and formation of metal lines connecting photodiode's top contact to the outside pad;
(viii) etching out the backside of the substrate to open the incident area, and;
(ix) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array of N×N photodiode elements, comprises,
(i) growing the layers forming the photodiode structure on the substrate;
(ii) patterning and formation of the top ohmic contacts of N×N;
(iv) deposition of the dielectric layer and planarization;
(v) metallization at the backside of the substrate;
(vi) patterning and etch out the metal portion from the incident surface;

(vii) formation of bottom common ohmic contacts at the backside of the substrate;

(viii) etching out the backside of the substrate to open the incident area, and;

(ix) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure on the substrate;

(ii) deposition of the dielectric layer on the bottom side of the substrate;

(iii) patterning and etching out the dielectric portion from the bottom side to open the incident area;

(iv) patterning and formation of the top ohmic contacts of N×N;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;

(ix) patterning and formation of metal lines connecting photodiode's top contact to the outside pad;

(x) formation of dielectric or epoxy layer;

(xi) attachment of the quartz or semiconductor on the dielectric or epoxy layer;

(xii) etching out the backside of the substrate to open the incident area, and;

(xiii) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure on the substrate;

(ii) deposition of the dielectric layer on the bottom side of the substrate;

(iii) patterning and etching out the dielectric portion from the bottom side to open the incident area;

(iv) patterning and formation of the top ohmic contacts of N×N;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;

(ix) patterning and formation of metal lines connecting photodiode's top contact to the outside pad;

(x) etching out the backside of the substrate to open the incident area, and;

(xi) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure on the substrate;

(ii) deposition of the dielectric layer on the bottom side of the substrate;

(iii) patterning and etching out the dielectric portion from the bottom side to open the incident area;

(iv) patterning and formation of the top ohmic contacts of N×N;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;

(ix) etching out the backside of the substrate to open the incident area, and;

(x) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure as mentioned previously;

(ii) patterning and formation of the top ohmic contacts of N×N;

(iii) formation of the top-ohmic contacts for N×N elements;

(iv) etching of the top highly doped layer outside from the top contacts;

(v) deposition of the dielectric layer and planarization;

(vi) metallization at the backside of the substrate;

(vii) patterning and etch out the metal portion from the incident surface;

(viii) formation of bottom common ohmic contacts at the backside of the substrate;

(ix) patterning and formation of metal lines connecting photodiode's top contact to the outside pad;

(x) formation of dielectric or epoxy layer;

(xi) attachment of the quartz or semiconductor on the dielectric or epoxy layer;

(xii) etching out the backside of the substrate to open the incident area, and;

(xiii) deposition of the passivation layer as the AR coat on the incident surface.

According to the invention, the fabrication process of the photodiode array of N×N elements, comprises, (i) growing the layers forming the photodiode structure as mentioned previously;

(ii) patterning and formation of the top ohmic contacts of N×N;

(iii) formation of the top-ohmic contacts for N×N elements;

(iv) etching of the top highly doped layer outside from the top contacts;

(v) deposition of the dielectric layer and planarization;

(vi) metallization at the backside of the substrate;

(vii) patterning and etch out the metal portion from the incident surface;

(viii) formation of bottom common ohmic contacts at the backside of the substrate;

(ix) patterning and formation of metal lines connecting photodiode's top contact to the outside pad;
(x) etching out the backside of the substrate to open the incident area, and;
(xi) deposition of the passivation layer as the AR coat on the incident surface.

According to the invention, the fabrication process of the photodiode array of N×N elements, comprises,
(i) growing the layers forming the photodiode structure as mentioned previously;
(ii) patterning and formation of the top ohmic contacts of N×N;
(iii) formation of the top-ohmic contacts for N×N elements;
(iv) etching of the top highly doped layer from outside the top contacts
(v) deposition of the dielectric layer and planarization;
(vi) metallization at the backside of the substrate;
(vii) patterning and etch out the metal portion from the incident surface;
(viii) formation of bottom common ohmic contacts at the backside of the substrate;
(ix) etching out the backside of the substrate to open the incident area, and;
(x) deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises,
(i) growing the layers forming the photodiode structure as mentioned previously;
(ii) deposition of the dielectric layer on the bottom side of the substrate;
(iii) patterning and etching out the dielectric portion from the bottom side to open the incident area;
(iv) formation of the top-ohmic contacts for N×N elements;
(v) etching of the top highly doped layer outside from the top contacts;
(vi) deposition of the dielectric layer and planarization;
(vii) patterning and etching to make the hole from top to first highly doped layer or up to the substrate;
(viii) formation of the dielectric layer;
(ix) patterning and etching the dielectric layer outside the etched hole;
(x) metallization and formation of the bottom common ohmic contact which is connected from the top;
(xi) patterning and formation of metal lines connecting photodiode's top contact to the outside pad;
(xii) formation of dielectric or epoxy layer;
(xiii) attachment of the quartz or semiconductor on the dielectric or epoxy layer;
(xiv) etching out the backside of the substrate to open the incident area, and;
(xv) deposition of the passivation layer as the AR coat on the incident surface.

According to the invention, the fabrication process of the photodiode array of N×N elements, comprises,
(i) growing the layers forming the photodiode structure as mentioned previously;
(ii) deposition of the dielectric layer on the bottom side of the substrate;
(iii) patterning and etching out the dielectric portion from the bottom side to open the incident area;
(iv) formation of the top-ohmic contacts for N×N elements;
(v) etching of the top highly doped layer outside from the top contacts;
(vi) deposition of the dielectric layer and planarization;
(vii) patterning and etching to make the hole from top to first highly doped layer or up to the substrate;
(viii) formation of the dielectric layer;
(ix) patterning and etching the dielectric layer outside the etched hole;
(x) metallization and formation of the bottom common ohmic contact which is connected from the top;
(xi) patterning and formation of metal lines connecting photodiode's top contact to the outside pad;
(xii) etching out the backside of the substrate to open the incident area, and;
(xiii) deposition of the passivation layer as the AR coat on the incident surface.

According to the invention, the fabrication process of the photodiode array of N×N elements, comprises,
(i) growing the layers forming the photodiode structure as mentioned previously;
(ii) deposition of the dielectric layer on the bottom side of the substrate;
(iii) patterning and etching out the dielectric portion from the bottom side to open the incident area;
(iv) formation of the top-ohmic contacts for N×N elements;
(v) etching of the top highly doped layer outside from the top contacts;
(vi) deposition of the dielectric layer and planarization;
(vii) patterning and etching to make the hole from top to first highly doped layer or up to the substrate;
(viii) formation of the dielectric layer;
(ix) patterning and etching the dielectric layer outside the etched hole;
(x) metallization and formation of the bottom common ohmic contact which is connected from the top;
(xi) etching out the backside of the substrate to open the incident area, and;
(xii) deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

It is an object of this invention to provide the bonding technique of the single photodiode and photodiode array on the carrier on which the logic circuit is bonded or monolithically fabricated.

According to this invention the bonding process of the bottom incident photodiode having broad spectral detection ranges (covering from <300 nm to 1700 nm and also <300 nm to 2500 nm) comprises the bonding of the upside down photodiode (and array) to the carrier wherein the same number pads as that of the photodiode array are present for electrical connections. The detector array is bonded by the flip-chip bonding technique using the solder bumps in between the contacts.

According to these inventions, the detector array having the metal line connecting each contact to the outside pads can be connected with the pads to carrier pads by flip-chip bonding.

According to this invention, the detector having the contacts itself as the pads can be directly bonded with the pads on the carrier, layout designed compatible for the detector array.

According to this invention, the detector array previously described having the quartz or semiconductor for making easiness of etching of substrate, can also be bonded on the carrier having the logic circuit using the flip-chip bonding.

The difference here is that the carrier is designed with groove to fit the quartz or semiconductor attached on the photodiode array. The high thermal conductive epoxy can be used in the space between the groove and quartz or semiconductor.

According to this invention, the substrate could be InP or GaAs, and absorption layer is InGaAs or InGaP with thickness appropriate to get broad ranges of the spectral responses (from <300 nm to 1700 nm and also possible to get from <300 nm to 2500 nm), high quantum efficiency and high frequency response.

According to this invention, the interface between the InP and InGaAs can be made smooth junction using the grading layer in between.

The invention offers to detect broad detection ranges varying from UV to near infrared as high as 2500 nm with high quantum efficiency and high frequency response. With proper design and fabrication process, N×N photodiodes array can be fabricated with capability of independently addressable each photodiode. The photodiode array will have the CCD like feature with broad spectral detection capability. The signal processing circuit can also be integrated monolithically or hybrid. These inventions could be easily implementable as today's manufacturing technology can be used. The detector mentioned in this invention will be used for multiple purpose optical detection for many applications.

Another advantage of this invention is that conventional material and IC fabrication technology can be usable to fabricate this photodiode and its array.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIGS. 5A to 5D is the schematics showing the cross-sectional views of the fabrication process for the top-illuminated photodiode array in the third embodiment in accordance to the present invention.

FIGS. 6A to 6E is the schematics showing the cross-sectional views of the fabrication process for the top-illuminated photodiode array in the fourth embodiment in accordance to the present invention.

FIGS. 7A and 7B are the schematics showing cross-sectional views of the back-illuminated photodiode structures having spectral responses from <300 nm to 1700 nm in the fifth embodiment in accordance to the present invention;

FIGS. 9A, 9B, and 9C are the schematics showing the cross-sectional view of back-illuminated photodiode structures having broad spectral responses in the seventh embodiment in accordance to the present invention;

FIGS. 10A, 10B, 10C are the schematics showing the cross-sectional view of back-illuminated photodiode structures having broad spectral responses in the eight embodiment in accordance to the present invention;

FIGS. 11A, 11B, 11C are the schematics showing the cross-sectional view of back-illuminated photodiode structures having two contacts on the top in the ninth embodiment in accordance to the present invention;

FIG. 12A to FIG. 12D is the schematics showing the fabrication processes of the back-illuminated single photodiode in the tenth embodiment in accordance to the present invention;

FIG. 13A to FIG. 13D is the schematics showing alternative fabrication processes of the back-illuminated single photodiode in the eleventh embodiment in accordance to the present invention;

FIG. 14A to 14E are the schematics showing the cross-sectional views of the fabrication process for the back-illuminated photodiode array having interconnection metal lines in the twelfth embodiment in accordance to the present invention.

FIGS. 15A to 15D are the schematics showing the cross-sectional views of the fabrication process for the back-illuminated photodiode array having interconnection metal lines in the thirteenth embodiment in accordance to the present invention.

FIGS. 16A to 16C are the schematics showing the cross-sectional views of the fabrication process for the back-illuminated photodiode array without having interconnect metal lines in the fourteenth embodiment in accordance to the present invention.

FIGS. 18A to 18D are the schematics showing the cross-sectional views of the fabrication process for the back-illuminated photodiode array having both contacts on the top and also having interconnection metal lines in the sixteenth embodiment in accordance to the present invention.

FIG. 19A to 19C are the schematics showing the cross-sectional views of the fabrication process for the back-illuminated photodiode array having both contacts on the top and without having interconnect metal lines in the seventeenth embodiment in accordance to the present invention.

FIG. 20A to 20F are the schematics showing the cross-sectional views of the fabrication process for the back-illuminated photodiode array having interconnection metal lines in the eighteenth embodiment in accordance to the present invention. In this case, the top highly doped is etched away to isolate each pixel to reduce the noise or cross-talk.

FIGS. 22A to 22D are the schematics showing the cross-sectional views of the fabrication process for the back-illuminated photodiode array without having interconnect metal lines in the twentieth embodiment in accordance to the present invention. In this case, the top highly doped (with or without a portion of absorption layer) is etched away to isolate each pixel to reduce noise or cross-talk.

FIGS. 23A to 23F are the schematics showing the cross-sectional views of the fabrication process for the back-illuminated photodiode array having both contacts on the top and also having interconnection metal lines in the twenty-first embodiment in accordance to the present invention. In this case, the top highly doped (with or without a portion of absorption layer) is etched away to isolate each pixel to reduce noise or cross-talk.

FIGS. 27A and 27B are the schematics showing the cross-sectional views of the bonding method for the back-illuminated photodiode (and array) having the quartz or semiconductor on the top in the twenty-fifth embodiment in accordance to the present invention.

DESCRIPTION OF THE PREFERRED EMBODIMENTS

Figure 1A:
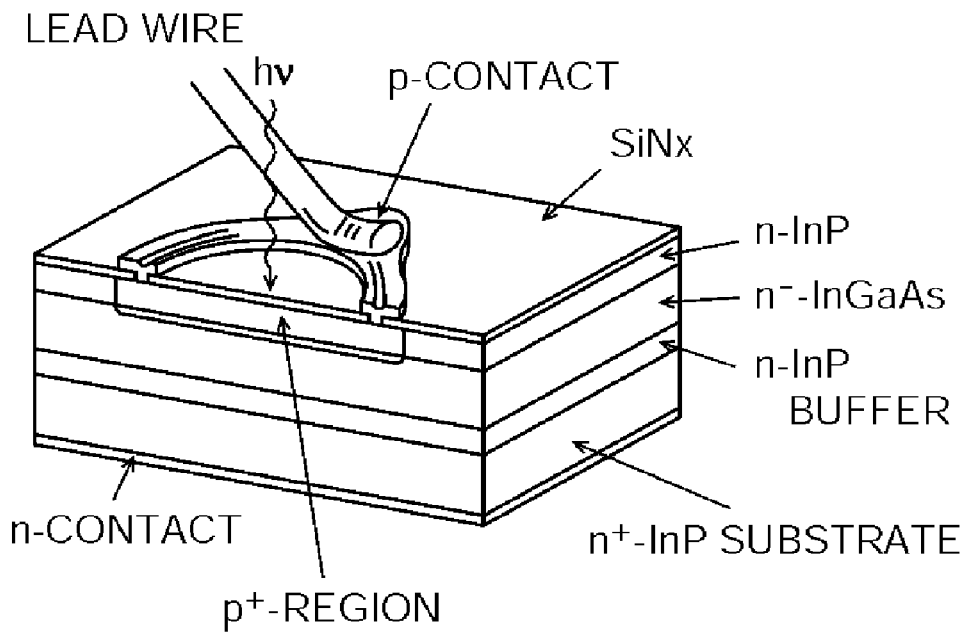
FIGS. 1A and 1B are the schematics showing the cross-sectional views of photodiode structures. These are the explanatory diagrams showing the prior-art of today's photo diode.

The best modes for carrying out the present invention will be described in turn with reference to the accompanying drawings. In the following description, the same reference numerals denote components having substantially the same functions and arrangements, and duplicate explanation will be made only where necessary.

Here the structure and design we mention are for both top (also mentioned as 'front')-illuminated and bottom (also mentioned as 'back')-illuminated type photodetector and their array having broad spectral detection ranges. The main objective of this invention is to make the broad spectral detector and their array using the InGaAs as the absorption layer and fabricated on the InP or GaAs substrate. This covers all photodiode and their array with broad spectral detection ranges from <300 nm to 1700 nm and also <300 nm to 2500 nm, which uses the InGaAs as the absorption layer. With changing the structures a little similar feature photodiode can also be made.

Figure 1B:
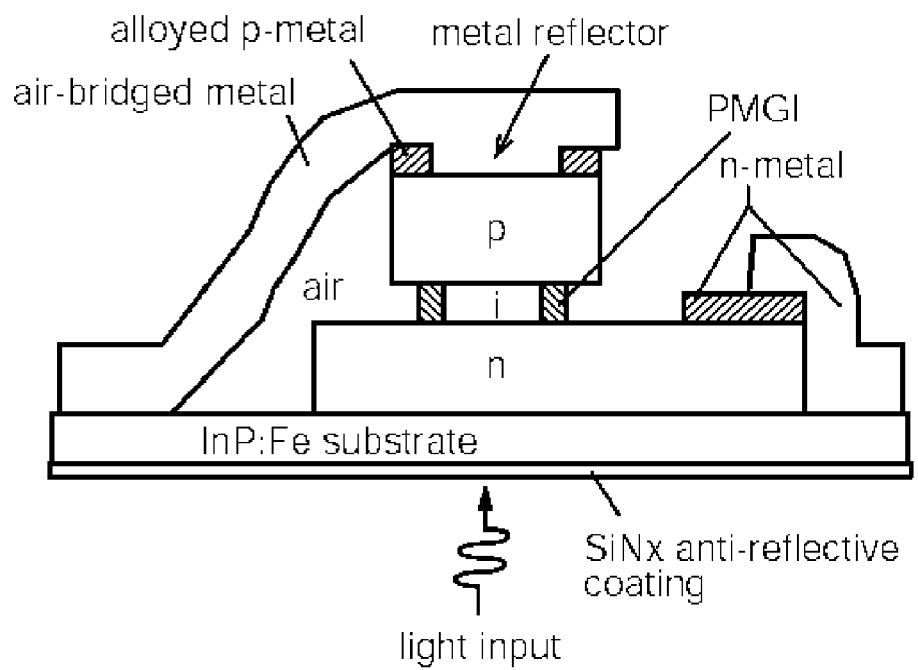

Indium phosphide (InP) based photodiodes especially of p-i-n type have been studied extensively over the last decade for its application in optical communication. These photodiodes are based on the structure and material system, which can detect the wavelengths covering from 1000 nm to 1600 nm. FIGS. 1A and 1B show a cross-sectional view of prior art of photodiodes of top emitting and bottom type. In most cases a thin layer of InGaAs, acting as the absorption region, is sandwiched between two layers of doped InP. These two materials (InGaAs and InP) combination used in the photodiode determine mainly photodiode's spectral detection region. Details of the prior art photodiode can be found in the chapter written by K. Taguchi, in the book, entitled "*WDM Technologies: Active Optical Components*" (Editor: A. K Dutta), published by Academic Press, Boston, Mass.

Figure 2A:
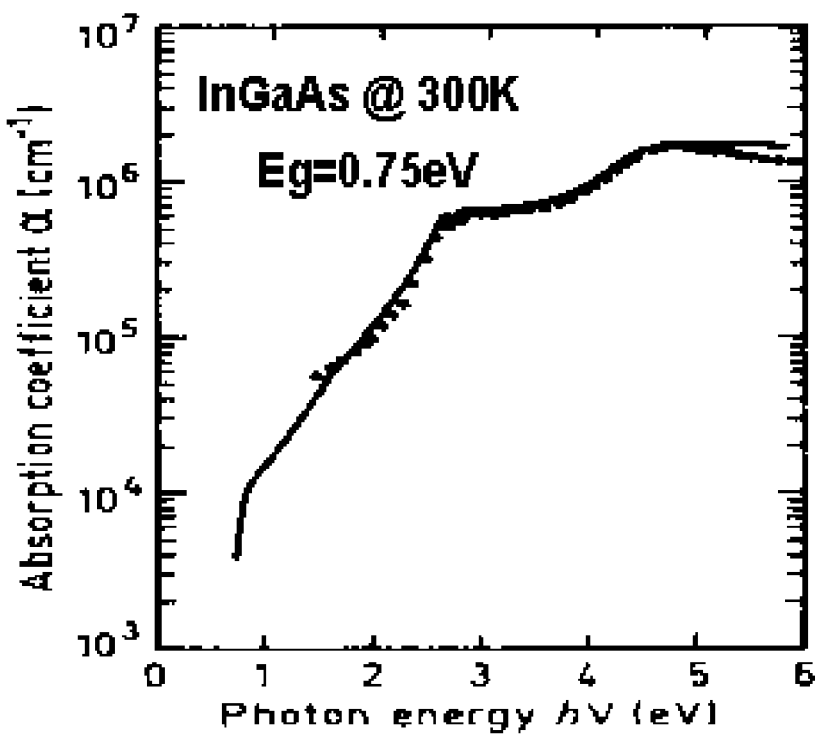
FIG. 2A—InGaAs of bandgap (0.75 eV), and FIG. 2B—InP of bandgap 1.34 eV versus photon energies.
Figure 2B:
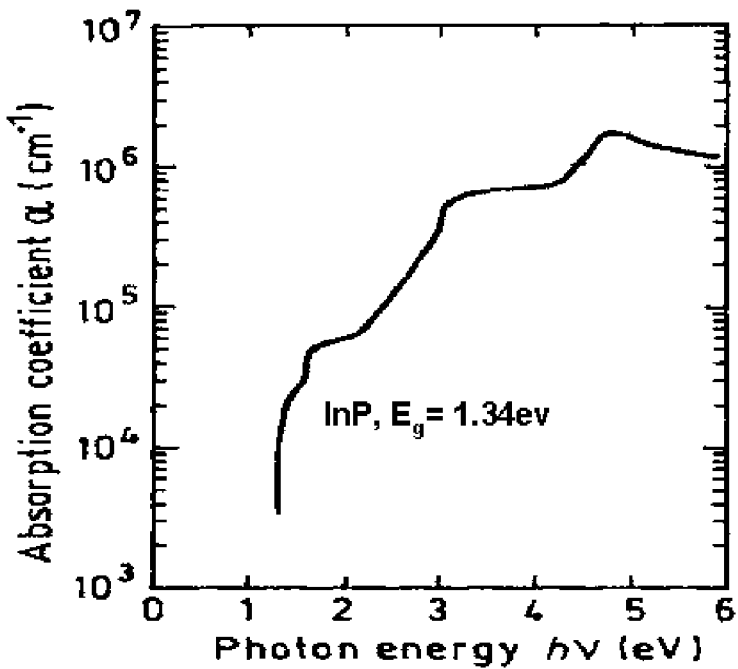
FIG. 2 are the absorption coefficient.

The absorption spectra of InGaAs (lattice matched to InP) and InP materials are shown in FIGS. 2A and 2B. The bandgaps of InGaAs and InP are 0.75 eV and 1.34 eV, which correspond to wavelengths of ~1650 nm and ~950 nm, respectively. The absorption coefficient of these material increases with increasing of photon energy. Any photodiode made using InGaAs as the active absorption layer is expected to absorb all the wavelengths from UV (ultraviolet) to 1650 nm unless some photons are selectively blocked.

After carefully looking at FIGS. 1 and 2, one can understand why conventional device structure as shown in FIGS. 1A and 1B cannot respond to any photon with a wavelength below 1000 nm. The reason is that the InP contact layer absorp the light of wavelengths below 950 nm. Any photon absorption in doped InP contact layers doesn't generate any electrical response in the device (if carrier diffusion is neglected). Thus, photodiodes in prior art are not suitable for broad spectral ranges covering from <300 nm to 1650 nm and also <300 nm to 2500 nm.

In the prior art (not shown here), a wafer bonding technique (not shown) is also usually used to design a photodetector with wide spectral response. In such devices, longer wavelengths are absorbed by a device structure shown in FIG. 1, while shorter wavelengths are detected by a Silicon photodiode, wafer bonded to an InP based structure. As the linear thermal expansion coefficient (TEC) of InP and Si are $4.60 \times 10^{-6}$ $C^{-1}$ and $2.6 \times 10^{-6}$ $C^{-1}$, respectively, the TCE mismatches cause stress in a wafer-bonded structure in wide temperature ranges operation. In addition, making an array with a wafer bonded structure poses a great challenge in designing interconnect with the aim of addressing individual pixels.

If the photodiode structure consists of InGaAs (lattice matched to InP) as an absorption layer, and ohmic contact layers which do not absorb significant number of photons, the photodiode can be used in wide spectral regions covering from UV to 1650 nm and also from UV to 2500 nm. In the present invention, the photodiode structures are mentioned which could have broad spectral range detection varying from UV to 1650 nm and also UV to 2500 nm with high quantum efficiency and high frequency response. The detector can also be used for wide range of detection where InGaAs absorb. For example from 250 nm to 1700 nm spectral detection and also 250 nm to 2500 nm, can be possible using the photodetector mentioned here. For the sake of understanding, we explain separately the photodetectors (and their arrays) having the <300 nm to 1700 nm detection ranges and <300 nm to 2500 nm detection ranges. Also we explain the top-illuminated photodetector (photodetector on which light is illuminated from the top) and bottom-illuminated (photodetector on which light is illuminated from the bottom (substrate side)) type both detectors and their process.

A. Top-Illuminated Type i) Photodetector (and its Array) Structure for <300 nm to 2500 nm Detection FIG. 3 shows the schematic showing a cross-sectional view of the photodetector having wide spectral detection ranges from <300 nm to 2500 nm in the first embodiment in accordance to the present invention, wherein the same numerals are the same parts so that repeated explanation is omitted here.

Figure 3:
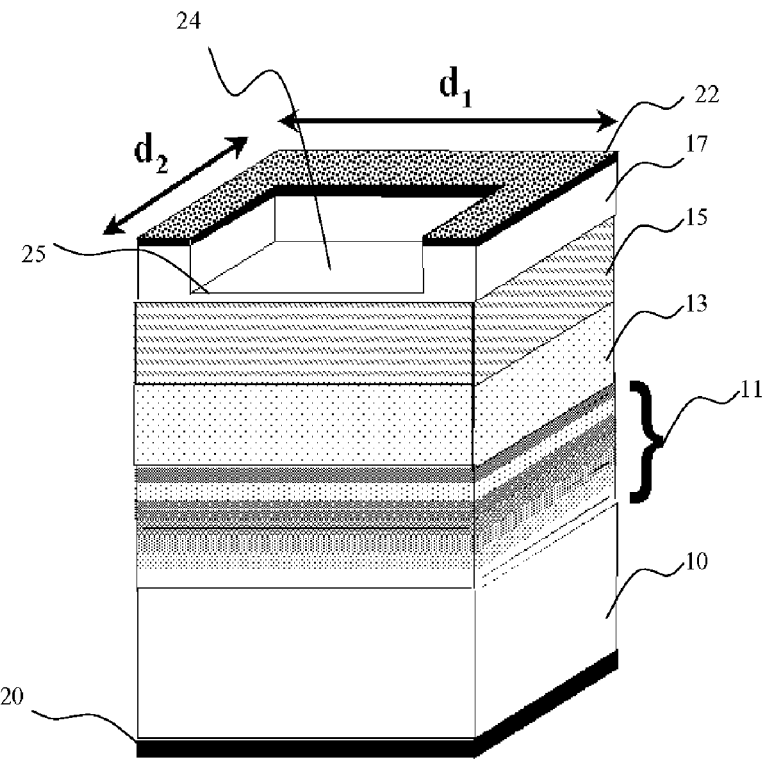
FIG. 3 is the schematic showing the cross-sectional view of a top-illuminated photodiode structure having the spectral responses from <300 nm to 2500 nm in the first embodiment in accordance with the present invention.
Figure 4:
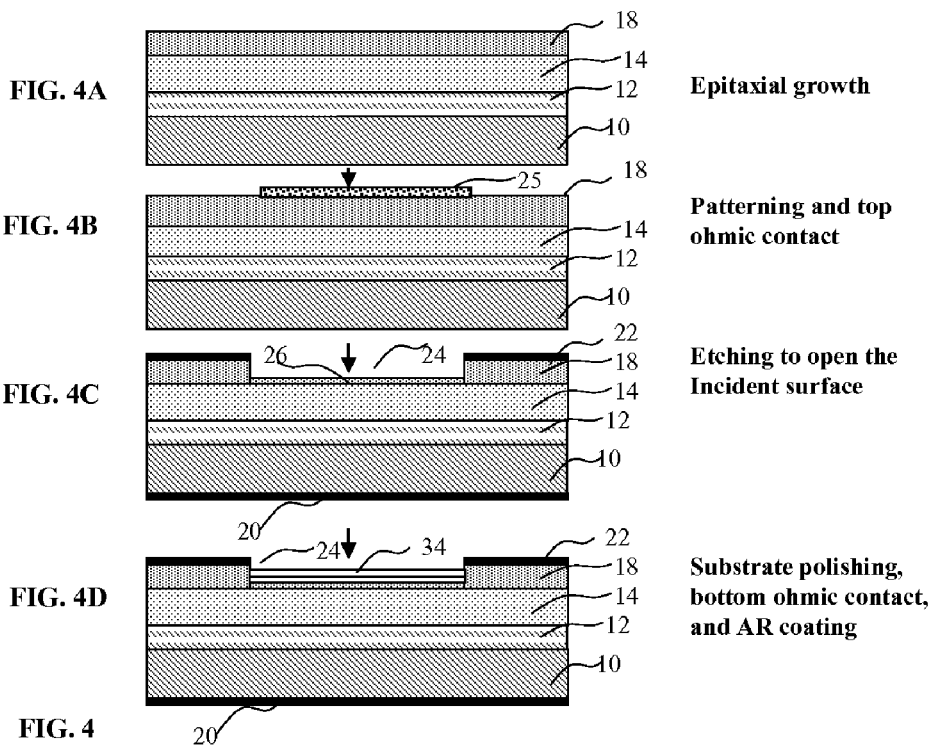
FIG. 4A to FIG. 4D is the schematics showing alternative fabrication process of the top-illuminated single photodiode in the second embodiment in accordance with the present invention.

Photodiode material layers structure as shown in FIG. 3, consists of n type InP substrate 10, n+ and low doped $InAs_yP_{1-y}$ buffer layers 11, $InAs_{0.6}P_{0.4}$ layer 13, $In_{0.8}Ga_{0.2}As$ layer 15 as absorption layer, highly doped $InAs_{0.6}P_{0.4}$ layer 17 for ohmic contact. Photodiode has the n type ohmic contact 20 at the backside of the substrate 10, and p type of ohmic contact 22 at the top of the photodiode. The photodiode has the opening incident surface 24 at the top for incident the light. A thin layer of recessed $InAs_{0.6}P_{0.4}$ 25 layer is left in the opening surface to extend the electrical field over the incident surface. The photodiode has the shape of rectangular or square having the width and length of $d_1$ and $d_2$, respectively. The width of the top ohmic contact 22 can have the 1 μm to 2 μm, appropriate for the ohmic contact using the standard photolithography technique. The details of this fabrication process will be explained later section. Using the nano-imprint (not shown), however, the width can be reduced to nanoscale level and incident surface area can be increased, and also the pixel size can be reduced.

According to this invention, the graded composition is used in between the $In_{0.8}Ga_{0.2}As$ 15 and InP substrate 10 to reduce the dark current. The absorption layer $In_{0.8}Ga_{0.2}As$ 15 could be intrinsic or slightly n doped layer. As the top ohmic contact layer, InGaAs or InP layer can be used. In the case of InP layer, the thickness is needed to be thin enough to reduce the absorption of the light in the shorter wavelength regions.

According to this invention, $InAs_{0.6}P_{0.4}$ layers 17 are used as the contact layer. If high doping of $InAs_{0.6}P_{0.4}$ appropriate for ohmic contact is not possible, a thin layer of highly doped InGaAs layer (not shown) can be used on the $InAs_{0.6}P_{0.4}$ layer 17.

The top ohmic contact (p-doped) InGaAs layer is made to thin close to ~10 nm or less to reduce the absorption and also reduce diffusion induced current. For 10 nm InGaAs thickness, the doped InGaAs thin layer will absorb less than 1% of the input power at 1650 nm wavelength and less than 5% at <300 nm wavelengths. Incorporating a thin spacer layer in between intrinsic absorption layer and p-ohmic contact layer will prevent the p-dopant from diffusing to absorption layer.

The absorption layer thickness can be varied from 0.25 to 4 μm to increase the quantum efficiency while compromising with the frequency response. It is estimated that the photodiode with thick absorption layer of 3.5 μm $Ga_{0.47}In_{0.53}As$ that ensures a quantum efficiency (QE) of more than 90% at 1650 nm wavelength and much higher QE for shorter wavelengths as is suggested by FIG. 2A.

In the preferred embodiment as shown in FIG. 3, the photodiode shape is shown to be square or rectangular, the shape can be also circular or ellipsometric, as necessary for the specific application. With using the similar approach, bottom incident type photodiode can also be designed. The photodiode can be 5 μm×5 μm with an opening of 3 μm×4 μm for receiving light. For using of the highly $p^{++}$ doped InGaAs layer, $In_{0.47}Ga_{0.53}As$ type with highly doped p– can be used. The p-ohmic contact is a thin ohmic contact on a highly doped InGaAs layer with a dopant concentration of $>10^{20}/cm^3$. The frequency response of the structure is estimated to be 8 GHz at 3 dB. The capacitance of the device is in the sub femto-Farad range due to the small junction area, and thick absorption layer. Overall frequency response is limited by the transit time response and the structure can easily operate above 5 GHz bandwidth at 3 dB with quantum efficiency greater than 90% for any wavelengths from <300 nm up to 1650 nm.

Alternatively, highly p-doped InP layer can also be used instead of highly p-doped $In_{0.47}Ga_{0.53}As$ on the top of the InGaAs absorption layer. The layer is to be made to thin to ~10 nm to suppress the InP absorption for the shorter wavelength light.

Each photodiode can have the junction area of below 5×5 μm² or more (square or circular shaped) with receiving area of approximately 3×4 μm² after considering the electrode width. The circular or rectangular shaped electrode shape can also be thought for the same photodiode. On single substrate, photodiode array of N×N can be made, and each photodiode element is etched to substrate to isolate from other photodiode array. This would suppress the cross talk below <0.1%. The photodiode array is expected to offer high quantum efficiency high speed>3 GHz at 3 dB (considering the parasitic of metal line), and also can be used in a wide range of temperatures and wavelengths.

Each photodiode element of the proposed array can also be rapidly and randomly addressed based on the metal connection scheme. The metal connection can be made using the standard photolithography technique. The advantage of this photodiode array including metal connection is that it can be fabricated using the less process step than conventional CCD or CMOS sensor.

ii) Fabrication Process a. Single Photodetector

FIGS. 4A to 4D are the schematics showing the fabrication process of the single photodiode element in accordance to the present invention wherein the same parts are represented by the same numerals so that repeated explanation is omitted here. This fabrication process described here is only for example. The required buffer InP layer 12, absorption layer InGaAs 14, and high doped InGaAs layer 18 are deposited on the substrate 10 using standard deposition techniques such as chemical vapor deposition, molecular beam epitaxial technique etc. Noted that, required spacer layer (not shown) avoiding the doping diffusion into the absorption layer may require. Patterning and subsequent dry etching would open the incident surface 24. The thin layer 26 of InGaAs is kept left, and its thickness is designed to reduce the absorption of the light, and also to distribute the electrical field uniformly over the incident surface. Metallization for bottom and top ohmic contacts 20 and 22 are made, which is followed by formation of the AR coating 34 on the front surface.

b. Photodetector Array

FIGS. 5A to 5B are the schematics showing the cross-sectional views of the alternate fabrication process of the photodiode array, wherein the like part is represented by the like numeral, so that repeated explanation is omitted here. In the preferred embodiment, the pitch and photodiode element size in the array are selected based on the quantum efficiency, speed, and detection resolution. In the preferred embodiment, after patterning of 25, formation of the ohmic contact 22 for N×N array is done. This is followed by the dry etching of portion of the top layer to open the incident surface portion 24, and the space between the photodiode element 36 are done. After top metallization for ohmic contact 22, dielectric layer 38 deposition and subsequent planarization is required to draw the metal line on the top of the surface. For planarization, standard chemical mechanical polishing (CMP) can be used. Required patternization, and subsequent metallization for the metal line 32 are required. Following polishing (not shown) and metallization for ohmic contact 20 at the backside of the substrate, AR coating 34 is done. Noted here that additional processes (not shown) (a) for etching out the dielectric layer from the incident surface, and (b) for etching more deeper down to the high resistive absorption layer to isolate the each photodiode from each other. In the preferred embodiment, standard etching process such as reactive ion beam etching (RIBE) or reactive ion etching (RIE) technique can be used. Wet etching technique can also be used instead of the dry-etching.

FIGS. 6A to 6E are the schematics showing the cross-sectional views of the alternate fabrication process of the photodiode array, in the tenth embodiment, wherein the like part is represented by the like numeral, so that repeated explanation is omitted here. In the preferred embodiment, after patterning of 25, formation of the ohmic contact 22 for N×N array is done. This is followed by the dry etching of portion of the top layer to open the incident surface portion 24. Afterwards, patterning and subsequent dry etching the layers up to the substrate surface outside each photodetector 37 to isolate electrically each photodiode element from each other. The process after this is same as that of FIG. 5, so that repeated explanation is omitted here. In the preferred embodiment, standard etching process such as reactive ion beam etching (RIBE) or reactive ion etching (RIE) technique can be used. Wet etching technique can also be used instead of the dry-etching.

In the preferred embodiment, photodiode structure (for <300 nm to 2500 nm detection) consisting of the InP substrate, InAsP buffer layer, and InGaAs absorption layer, and InGaAs doping layer are shown. However, this covers all kinds of InGaAs (single or multiple layers having different bandgaps), covering the broad spectral ranges detector. In addition, instead of using the InAsP as the contact layer, highly doped InGaAs (not shown) can also be used. Alternately, thin layer of highly doped InGaAs (not shown) can be used on the top of the doped InAsP layer for the ohmic contact. Alternatively, the combination of the highly doped InAsP and high doped InGaAs layers (not shown) can also be used as the contact layer.

Alternatively, photodiode (<300 nm to 1700 nm) structure consists of the InP substrate, buffer layer, and InGaAs absorption layer, and InGaAs doping layer. In addition, instead of using the InGaAs as the doping layer, highly doped InAlAs (not shown) can also be used. In this case, the graded layer can be incorporated in the structure to reduce the minority carrier trapping at the InAlAs—InGaAs band edge discontinuity. Alternatively, the combination of the highly doped InAlAs and high doped InGaAs layers (not shown) can also be used as the contact layer.

B. Bottom-Illuminated Type
i) Detector Structure
a. Single Photodetector Structure for <300 nm to 1700 nm Detection FIG. 7A is the schematic showing the cross-sectional view of the bottom-illuminated single photodetector having spectral detection ranges from <300 nm to 1700 nm in accordance to the present invention. Photodiode structure as shown in FIG. 7A, consists of n type InP substrate 10, single thin n+ InP buffer layer or combination of the InP and InGaAs layers (not shown) 42, InGaAs absorption layer 14, spacer layer of InGaAs layer or low doped InP 16, highly doped InP or InGaAs ohmic contact layer 18. Photodiode has the n type ohmic contact 20b at the backside of the substrate 10, and p type of ohmic contact 22b at the top of the photodiode. The photodiode has the opening incident surface 44 at the bottom for illuminating the light 46. The substrate is etched-off to open the incident surface 44. A thin layer of the InP 42 is layer is left underneath the opening surface to extend the electrical field over the incident surface. The anti-reflection coating 34b can be formed on the incident surface to reduce the reflection loss of the incident light. The photodiode has the shape of rectangular or square having the width and length of $d_1$ and $d_2$, respectively (not shown). The width of the top ohmic contact 22b can have the 1 μm to 2 μm, appropriate for the ohmic contact using the standard photolithography technique. The details of this fabrication will be explained later section.

FIG. 7B is the schematic showing the cross-sectional view of the bottom-illuminated single photodetector having spectral detection ranges from <300 nm to 1700 nm in accordance to the present invention, wherein the same numerals represents the same parts so that repeated explanation is omitted here. The photodiode structure is same as that of the photodetector structure as explained in FIG. 7A. Only difference is that the bottom electrode 20c (which can be an n-type ohmic contact) is taken out monolithically from the top for the easiness in the bonding. The details of this fabrication will be explained later section.

According to this invention, the bottom ohmic contact (n-doped) InP or combination of InGaAs and InP layers 42 is made to thin close to ~10 nm or less to reduce the absorption and also reduce diffusion induced current. For 10 nm InGaAs thickness, the doped InGaAs thin layer will absorb less than 1% of the input power at 1650 nm wavelength and less than 5% at <300 nm wavelengths. Incorporating a thin spacer layer 16 in between intrinsic absorption layer and p-ohmic contact layer 18 will prevent the p-dopant from diffusing to absorption layer.

The absorption layer thickness could be 1 to 5 μm to increase the quantum efficiency with compromising with the frequency response. It is estimated that the photodiode with thick absorption layer of 3.5 μm $Ga_{0.47}In_{0.53}As$ that ensures a quantum efficiency (QE) of more than 90% at 1650 nm wavelength and much higher QE for shorter wavelengths as is suggested by FIG. 2A.

In the preferred embodiment as shown in FIG. 7A, the photodiode shape is shown to be square or rectangular, the shape can be also circular or ellipsometric, as necessary for the specific application. The photodiode junction area can be made to below 5 μm.×5 μm. For using of the highly $p^{++}$ doped InGaAs layer, $In_{0.47}Ga_{0.53}As$ type with highly doped p– can be used. Dopant concentration of $>10^{20}/cm^3$ can be grown. For the case of $p^{++}$ InP as the contact layer, dopant concentration as high as $>10^{21}/cm^3$ can be possible. The frequency response of the structure is estimated to be 8 GHz at 3 dB. The capacitance of the device is in the sub femto-Farad range due to the small junction area, and thick absorption layer. Overall frequency response is limited by the transit time response and the structure can easily operate above 5 GHz bandwidth at 3 dB with quantum efficiency greater than 90% for any wavelengths from <300 nm up to 1700 nm.

Alternatively, highly n-doped InGaAs layer can also be used instead of highly n-doped $In_{0.47}Ga_{0.53}As$ on the top of the InP substrate and also bottom of the InGaAs absorption layer. The layer is to be made to thin to ~10 nm to suppress absorption for the shorter wavelength light.

b. Single Photodetector Structure for <300 nm to 2500 nm Detection

Figure 8A:
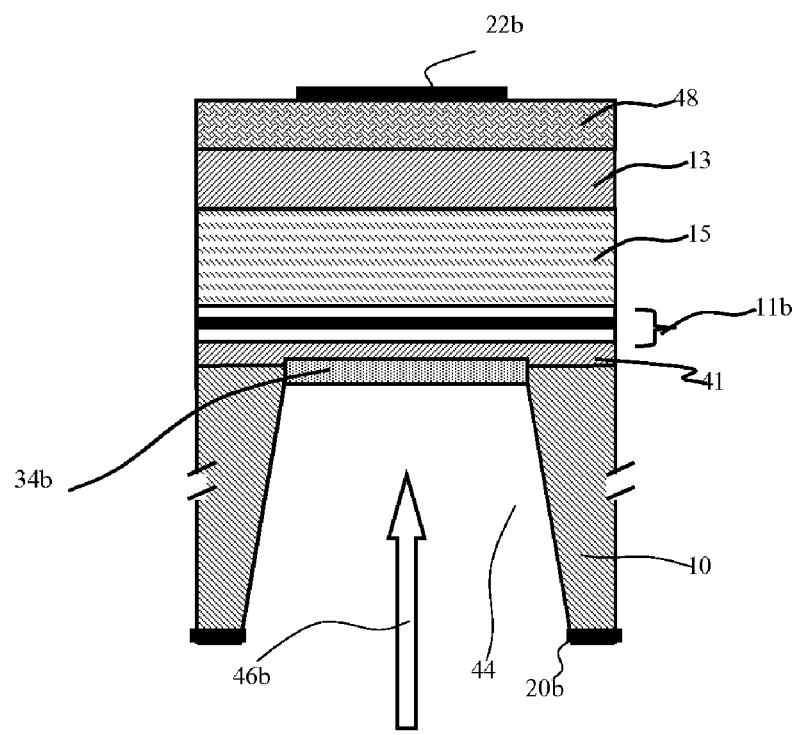
FIGS. 8A and 8B are the schematics showing cross-sectional views of back-illuminated photodiode structures having the spectral responses from <300 nm to 2500 nm in the sixth embodiment in accordance to the present invention.

FIG. 8A shows the schematic showing the cross-sectional view of the bottom-illuminated photodetector having wide spectral detection ranges from <300 nm to 2500 nm in accordance to the present invention, wherein the same numerals are the same parts so that repeated explanation is omitted here. Photodiode material layers structure as shown in FIG. 8A, consists of n type InP substrate 10, thin n+ InP 41 and low doped $InAs_yP_{1-y}$ buffer layers 11b, $In_{0.8}Ga_{0.2}As$ layer 15 as absorption layer, $InAs_{0.6}P_{0.4}$ layer 13, and highly doped InP 48 for ohmic contact. Photodiode has the n type ohmic contact 20b at the backside of the substrate 10, and p type of ohmic contact 22b at the top of the photodiode. The photodiode has the opening incident surface 44 at the top for incident the light.

Figure 8B:
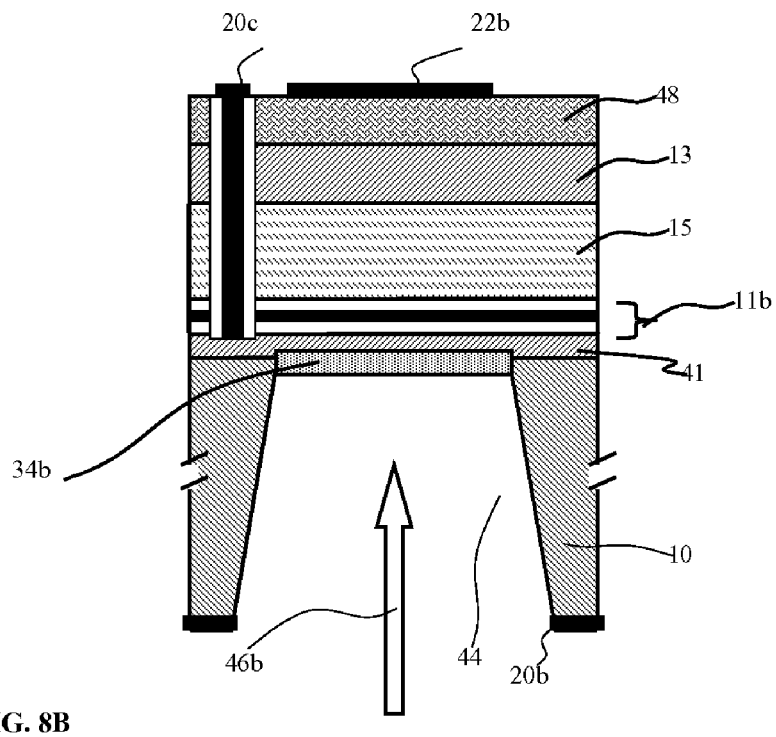

FIG. 8B is the schematic showing the cross-sectional view of the bottom-illuminated single photodetector having spectral detection ranges from <300 nm to 2500 nm in accordance to the present invention, wherein the same numerals represents the same parts so that repeated explanation is omitted here. The photodiode structure is same as that of the photodetector structure as explained in FIG. 8A. Only difference is that the bottom electrode 20c is taken out monolithically from the top for the easiness in the bonding. The details of this fabrication will be explained later section.

According to this invention, instead of using $InAs_{0.6}P_{0.4}$ layer 13, combination of $InAs_{0.6}P_{0.4}$ and $InAs_yP_{1-y}$ and/or their graded composition layers (not shown) can be used. Again, instead of using highly doped InP 48, or combination of high doped $InAs_{0.6}P_{0.4}$ layer and high doped InP or only highly doped $InAs_{0.6}P_{0.4}$ layer (not shown) can be used as the contact layer. If high doping of $InAs_{0.6}P_{0.4}$ appropriate for ohmic contact is not possible, a thin layer of highly doped InP layer as the contact layer (not shown) can also be used on the top of high doped $InAs_{0.6}P_{0.4}$. The absorption layer $In_{0.8}Ga_{0.2}As$ 15 could be intrinsic or slightly n doped layer.

According to this invention, a thin layer of etch stopper (not shown) can be used prior to forming thin layer of InP 41. The thickness of the thin layer of InP 41 (including etch stopper, if any) has to be selected to extend the electrical field over the incident surface. The photodiode has the shape of rectangular or square having the width and length of $d_1$ and $d_2$, respectively. The width of the top ohmic contact 22b can have the 1 μm to 2 μm, appropriate for the ohmic contact using the standard photolithography technique. The details of this fabrication process will be explained later section.

C. Photodetector Array Structure

FIG. 9A shows the schematic showing the cross-sectional view of the bottom-illuminated photodetector array having wide spectral detection ranges in accordance to the present invention, wherein the same numerals are the same parts so that repeated explanation is omitted here. Photodiode material layers structure as shown in FIG. 9A, which consists of n type InP substrate 10 and the photodiode structure 50 as mentioned in FIG. 7 or 8. Photodiode has the common n type ohmic contact 20b taken from bottom of the substrate 10. The p type of ohmic contact forms the individual pixel 52 independent with each other at the top of the photodiode. The photodiode has the opening incident surface 44 at the bottom of the substrate opened for incident the light 47. The interconnect line 54 from each pixel is laid on the insulator layer 56 to connect each pixel (each photodiode element) to the outside pad. There could be many ways to bond the array of photodiode 58. One example is shown in FIG. 9A. A thin layer of the insulator 60 can be used to make easiness in the bonding with the glass slab or insulator sheet 62 which cover the expose portion of the pixels. The antireflection coating 64 is used to reduce the reflection and increase the sensitivity.

FIGS. 9B and 9C are the schematic showing the cross-sectional view of the bottom-illuminated photodetector array having wide spectral detection ranges in accordance to the present invention, wherein the same numerals represents the same parts so that repeated explanation is omitted here. The photodiode structure is same as that of the photodetector structure as explained in FIG. 9A. Only difference in both FIGS. 9B and 9C are that the no bonding flat insulator is used on the top electrode, in the case of FIG. 9C, the direct bonding of the pixel 52 can be done.

FIGS. 10A, 10B, and 10C show the schematics showing the cross-sectional views of the bottom-illuminated photodetectors array having wide spectral detection ranges in accordance to the present invention, wherein the same numerals are the same parts so that repeated explanation is omitted here. Photodiode structure 50 is the same as that of shown in FIG. 9. Only differences in FIG. 10 are that, in order to reduce the cross-talk, each pixel is etched down so that photocurrent can't be followed to the neighborhood pixel. Also, to make easiness in the bonding, insulating layer 66 is used. Other is the same as that of FIG. 9, so that repeated explanation is omitted here.

FIGS. 11A, 11B, and 11C show the schematics showing the cross-sectional views of the bottom-illuminated photodetectors array having wide spectral detection ranges in accordance to the present invention, wherein the same numerals are the same parts so that repeated explanation is omitted here. Photodiode structure 50 is the same as that of shown in FIG. 10. Only differences in FIG. 11 are that, the bottom electrode 68 (which can be an n-type ohmic contact) has been taken out from top. Other is the same as that of FIG. 10, so that repeated explanation is omitted here.

ii) Fabrication Process a. Single Element

FIGS. 12A to 12D are the schematics showing the fabrication process of the single photodiode element in accordance to the present invention wherein the same parts are represented by the same numerals so that repeated explanation is omitted here. The fabrication process mentioned herewith will be the same for all detector structure for both broadband structures, mentioned earlier, only difference are the type of materials. We explain the fabrication of one structure, similar fabrication process can be used for the other structure.

This fabrication process described here is only for example. The detector structure 50 is deposited on the substrate 10 using standard deposition techniques such as chemical vapor deposition, molecular beam epitaxial technique etc. One after another, Patterning and subsequent metallization made the top electrode 70 and bottom electrode 20, and open the incident surface 72 at the bottom surface of the substrate 10. The bottom substrate is etched or thinned out to open the incident surface 44. Standard wet-etching technique can be used to etch out the substrate to open the incident surface. The antireflection coating can be used at the bottom surface to enhance the quantum efficiency or the sensitivity.

FIGS. 13A to 13D are the schematics showing the fabrication process of the single photodiode element in accordance to the present invention wherein the same parts are represented by the same numerals so that repeated explanation is omitted here. After making the top electrode 70, other substrate contact 68 is made on the top after making the etching the detector structure to expose to the substrate or buffer layer (not shown). Insulator deposition 76 not to connect with the detector structure and subsequent etching and metallization will make the contact 68. Several process steps consisting of the patterning, etching, deposition and metallization are necessary to make the substrate contact 68 taken on the top. The patterning and subsequent etching or thinning out the substrate to open the incident area 44 follows this. Other process step from here is same as explained earlier, so that repeated explanation will be omitted here.

b. Array

FIGS. 14A to 14E are the schematics showing the fabrication processes of the single photodiode array independently addressable in accordance to the present invention wherein the same parts are represented by the same numerals so that repeated explanation is omitted here. After the detector structure 50 grown on the substrate, the top electrode 52 to define each pixel is formed following patterning, metallization and etching. The dielectrics (or insulating) layer 56 is deposited and subsequent polishing using chemical mechanical polishing (CMP) process leave the flat surface with exposing of each metal contact 52 for each pixel. Following this, the bottom common electrode 20 for the array is formed after metallization. Subsequent patterning and etching would open the area 72 to etch-out the substrate for opening the incident surface. The interconnection 54 is made to connect each pixel to the outside after metallization and following patterning and etching. The lift-off process can also be used to make the interconnection 54. A thin layer of the insulating layer 60 (which could be oxide layer or nitride layer etc.) is deposited on the top surface, and this I followed by the quartz or flat substrate attachment to make the whole in packaging. Finally, the etching or thinning out of the substrate to open the incident area 44 for the light 47.

According to this invention, the fabrication process has been explained as a part of the example. The fabrication steps should not be in necessary as described. The order for the fabrication step can be changed.

FIGS. 15A to 15D are the schematics showing the fabrication processes of the single photodiode array independently addressable in accordance to the present invention wherein the same parts are represented by the same numerals so that repeated explanation is omitted here. The fabrication process as shown in FIG. 15 is almost the same as that of explained in FIG. 14. Only differences are that the processes for thin layer insulator deposition and flat substrate attachment are not necessary. Other are same as explained in FIG. 14, so that repeated explanation is omitted here.

FIGS. 16A to 16C are the schematics showing the fabrication processes of the single photodiode array independently addressable in accordance to the present invention wherein the same parts are represented by the same numerals so that repeated explanation is omitted here. The fabrication process as shown in FIG. 16 is almost the same as that of explained in FIGS. 14 and 15. Only differences are that the photodiode array in the FIG. 16 can be directly bonded to the carrier (not shown). The thin layer of the dielectrics 60 and the flat substrate 62 attachments as necessary in FIG. 14 and the interconnection 54 as shown in FIGS. 14 and 15, are not necessary. Other fabrication process already explained in FIGS. 14 and 15, so that repeated explanation is omitted here.

FIGS. 17A to 17E are the schematics showing the fabrication processes of the single photodiode array independently addressable in accordance to the present invention wherein the same parts are represented by the same numerals as shown in FIGS. 13 and 14 so that repeated explanation is omitted here. The fabrication process is almost same as that of FIG. 14. Only differences are that the bottom electrode is not formed at the back-side of the substrate, so that related process is not necessary here. After the top pixel contact is formed, the substrate contact 68 is made as explained in FIG. 13, so that repeated explanation is omitted here. Final step could be patterning at the back-side of the substrate to open the etch-out portion for incident area.

FIGS. 18A to 18D are the schematics showing the fabrication processes of the single photodiode array independently addressable in the twenty-second embodiment in accordance to the present invention wherein the same parts are represented by the same numerals so that repeated explanation is omitted here. The fabrication process as shown in FIG. 18 is almost the same as that of explained in FIG. 17. Only differences are that the thin layer insulator and flat substrate attachment is not necessary. The repeated explanation is omitted here.

Figure 17:
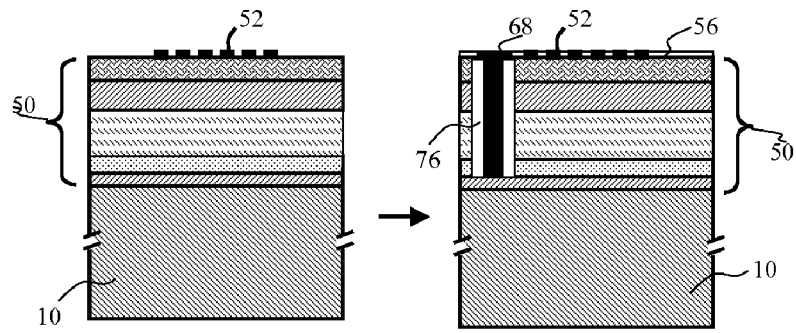
FIGS. 17A to 17E are the schematics showing the cross-sectional views of the fabrication process for the back-illuminated photodiode array having both contacts on the top and also having interconnection metal lines in the fifteenth embodiment in accordance to the present invention.
Figure 17:
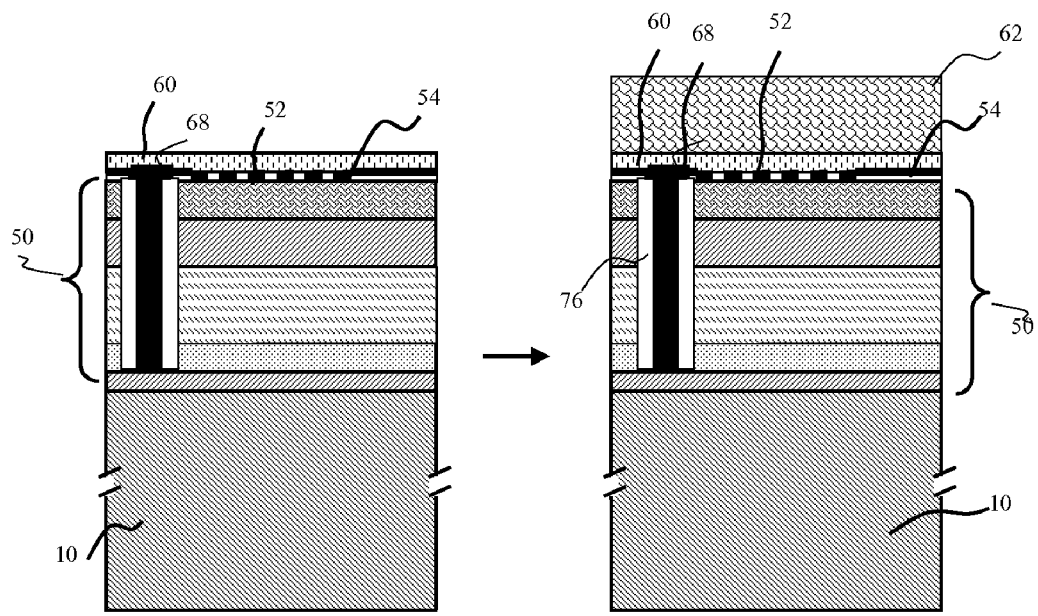

FIGS. 19A to 19C are the schematics showing the fabrication processes of the single photodiode array independently addressable in accordance to the present invention wherein the same parts are represented by the same numerals so that repeated explanation is omitted here. The fabrication process as shown in FIG. 19 is almost the same as that of explained in FIGS. 17 and 18. Only differences are that the photodiode array in the FIG. 19 can be directly bonded to the carrier (not shown). The thin layer of the dielectrics 60 and the flat substrate 62 attachments as necessary in FIG. 17 and the interconnection 54 as shown in FIGS. 17 and 18, are not necessary. The fabrication process already explained in FIGS. 17 and 18, so that repeated explanation is omitted here.

FIGS. 20A to 20F are the schematics showing the fabrication processes of the single photodiode array independently addressable in accordance to the present invention wherein the same parts are represented by the same numerals so that repeated explanation is omitted here. After the detector structure 50 grown on the substrate, the top electrode 52 to define each pixel is formed following patterning, metallization and etching. The fabrication process is same as that of explained in FIG. 14. Only differences are that after making the top metal contact, which makes the individual pixel, top surrounding high doped semiconductor layer (for ohmic contact) is etched out to reduce the crosstalk. Standard dry-etching process can be used. Based on the pitch, wet etching can also be used to etch out surrounding portion outside the pixel. The layer 80 left under each pixel could be high doped layer or more deep etching below high doped layer can be done, which would prevent to spread the field outside each pixel and thereby reduces the cross-talk. Following this, dielectric layer 56 is deposited to cover the etched area. The dielectrics are thicker than what is necessary in FIG. 14. After this, the fabrication process will be the same as that of explained in FIG. 14, so that repeated explanation is omitted here.

According to this invention, the fabrication process has been explained as a part of the example. The fabrication steps should not be in necessary as described. The order for the fabrication step can be changed.

FIGS. 21A to 21E are the schematics showing the fabrication processes of the single photodiode array independently addressable in accordance to the present invention wherein the same parts are represented by the same numerals so that repeated explanation is omitted here. The fabrication process as shown in FIG. 21 is same as that of explained in FIG. 20. Only differences are that the process for the thin layer insulator deposition and flat substrate attachment is not necessary. Other is same as explained in FIGS. 14 and 20, so that repeated explanation is omitted here.

Figure 21:
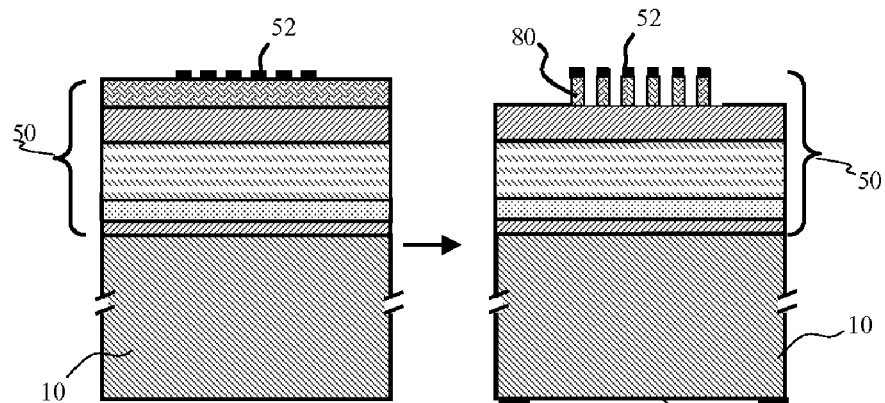
FIGS. 21A to 21E are the schematics showing the cross-sectional views of the fabrication process for the back-illuminated photodiode array having interconnection metal lines in the nineteenth embodiment in accordance to the present invention. In this case, the top highly doped (with or without a portion of absorption layer) is etched away to isolate each pixel to reduce the noise or cross-talk.
Figure 21:
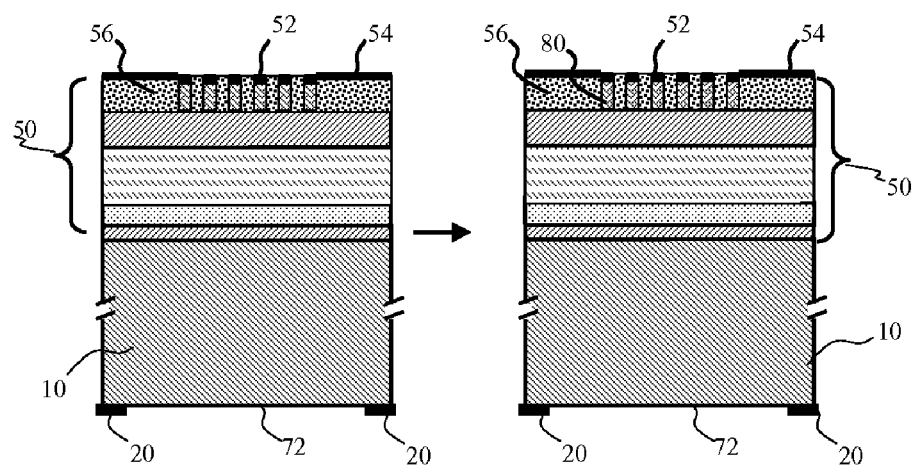
Figure 24:
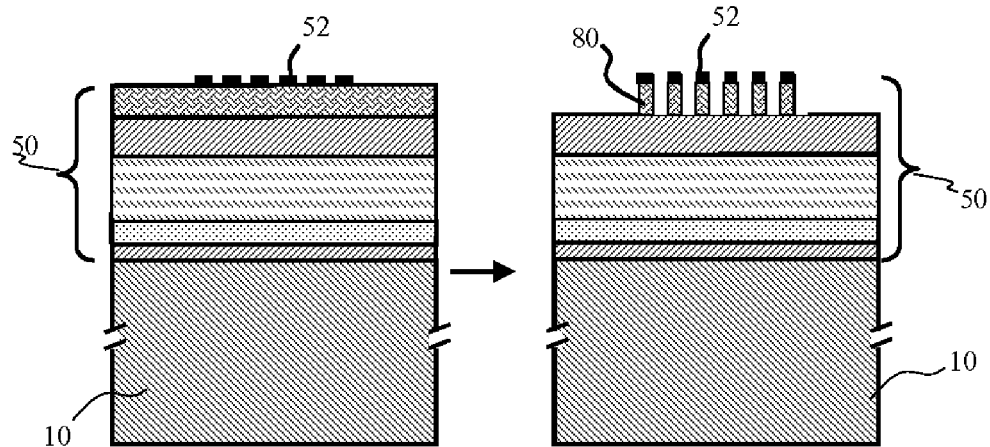
FIGS. 24A to 24D are the schematics showing the cross-sectional views of the fabrication process for the back-illuminated photodiode array having both contacts on the top and also having interconnection metal lines in the twenty-second embodiment in accordance to the present invention. In this case, the top highly doped is etched away to isolate each pixel to reduce the noise or cross-talk.
Figure 24:
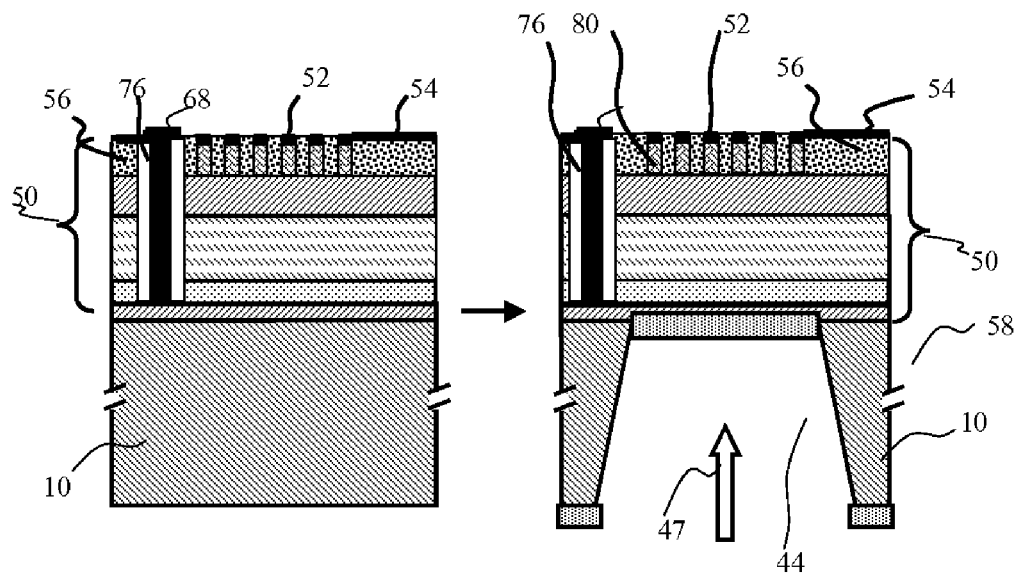
Figure 25:
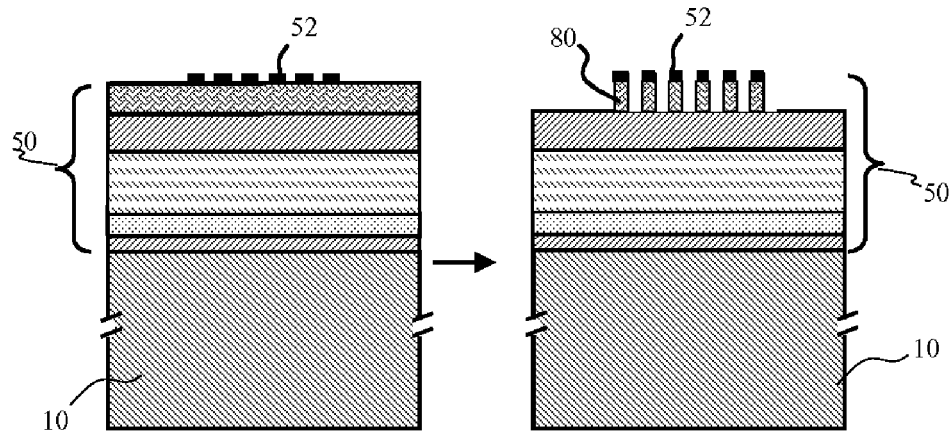
FIGS. 25A to 25D are the schematics showing the cross-sectional views of the fabrication process for the back-illuminated photodiode array having both contacts on the top and without having interconnect metal lines in the twenty-third embodiment in accordance to the present invention. In this case, the top highly doped (with or without a portion of absorption layer) is etched away to isolate each pixel to reduce the noise.
Figure 25:
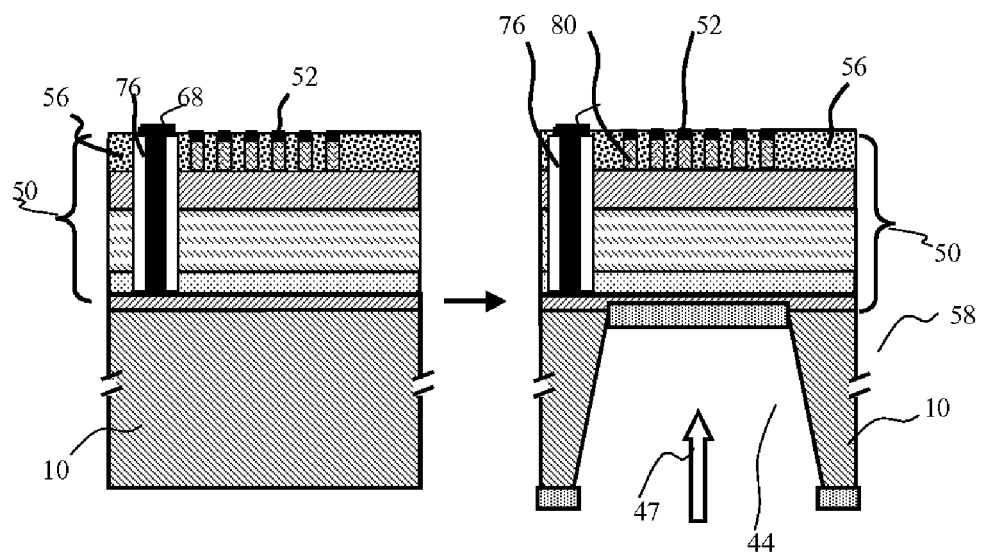

FIGS. 22A to 22D are the schematics showing the fabrication processes of the single photodiode array independently addressable in accordance to the present invention wherein the same parts are represented by the same numerals so that repeated explanation is omitted here. The fabrication process as shown in FIG. 22 is almost the same as that of explained in FIGS. 20 and 21. Only differences are that the photodiode array in the FIG. 22 can be directly bonded to the carrier (not shown). The thin layer of the dielectrics 60 and the flat substrate 62 attachments as necessary in the process explained in FIG. 20 and the interconnection 54 as shown in FIGS. 20 and 21, are not necessary. Other fabrication process is already explained in FIGS. 14, 15, 20 and 21, so that repeated explanation is omitted here.

FIGS. 23A to 23F are the schematics showing the fabrication processes of the single photodiode array independently addressable in accordance to the present invention wherein the same parts are represented by the same numerals as shown in FIGS. 13 and 14 so that repeated explanation is omitted here. The fabrication process is almost same as that of FIGS. 14 and 20. Only differences are that the bottom electrode is not formed at the back-side of the substrate, so that related process is not necessary here. After the top pixel contact formed, the substrate contact 68 is made as explained in FIG. 13, repeated explanation is omitted here. Final step could be patterning at the back-side of the substrate to open the etch-out portion for incident area.

FIGS. 24A to 24D are the schematics showing the fabrication processes of the single photodiode array independently addressable in accordance to the present invention wherein the same parts are represented by the same numerals so that repeated explanation is omitted here. The fabrication process as shown in FIG. 24 is almost the same as that of explained in FIGS. 14 and 20. Only differences are that the processes for thin layer insulator deposition, and flat substrate attachment are not necessary. Other is same as explained in FIGS. 14 and 20, so that repeated explanation is omitted here.

FIGS. 25A to 25D are the schematics showing the fabrication processes of the single photodiode array independently addressable in accordance to the present invention wherein the same parts are represented by the same numerals so that repeated explanation is omitted here. The fabrication process as shown in FIG. 25 is almost the same as that of explained in FIGS. 23 and 24. Only differences are that the photodiode array in the FIG. 25 can be directly bonded to the carrier (not shown). The thin layer of the dielectrics 60 and the flat substrate 62 attachment and the interconnection 54 are not necessary. The fabrication process already explained in FIGS. 17, 18, 20 and 23, so that repeated explanation is omitted here.

iii) Bonding Process

In previous sections, structure and fabrication process of the broadband band detector (single and array) are explained. This section covers the bonding process for the broadband detector according to this invention. For simplicity in explanation, we consider here broadband detector array having both contacts on the top. Similar bonding process can be used for all detector structures mentioned in this invention.

Figure 26A:
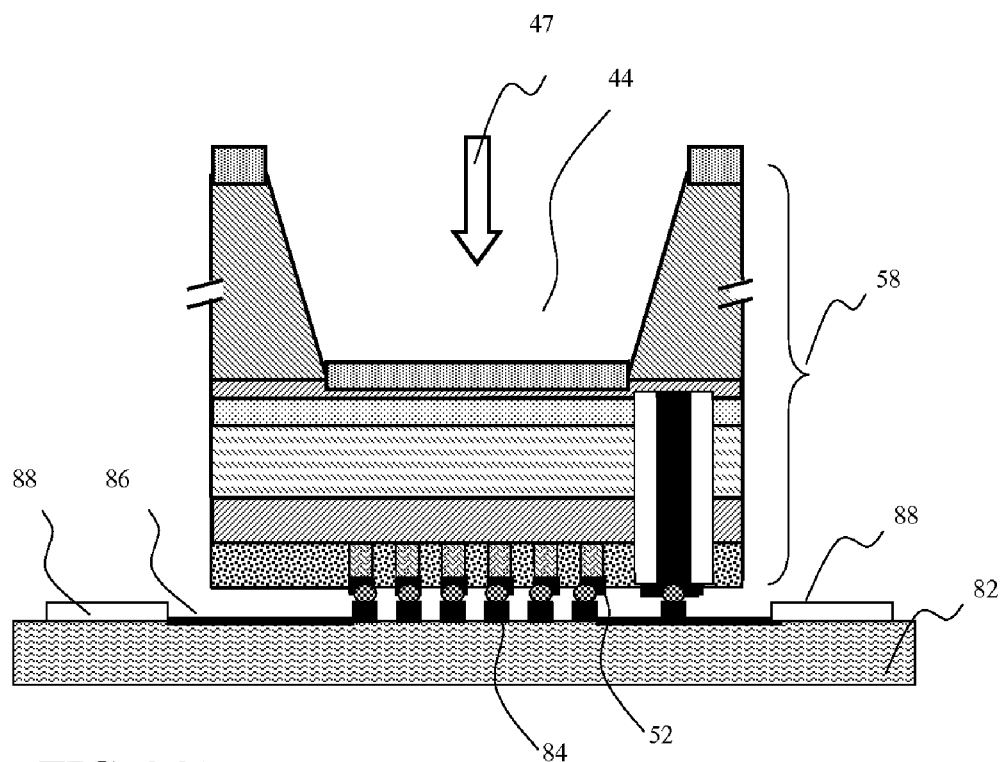
FIGS. 26A and 26B are the schematics showing the cross-sectional views of the bonding method for the back-illuminated photodiode (and array) to attach on the carrier having the logic circuit in the twenty-fourth embodiment in accordance to the present invention.
Figure 26B:
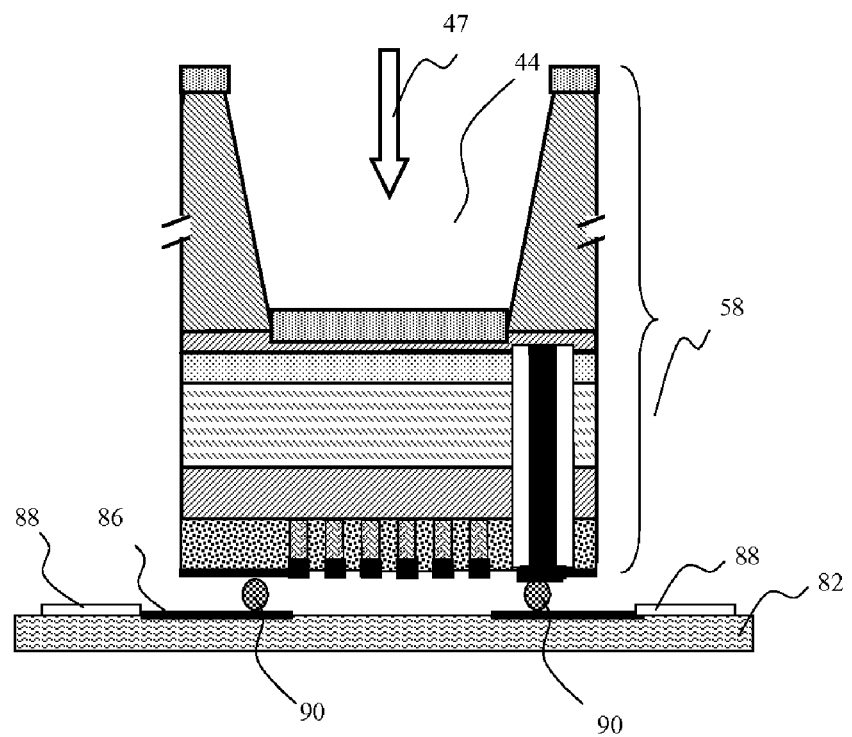

FIGS. 26A to 26B are the schematics showing the bonding technique photodiode array independently addressable in accordance to the present invention wherein the same parts are represented by the same numerals so that repeated explanation is omitted here. The detector array 58 is upside down bonded on the carrier (or board) 82 by the standard flip-chip technique or equivalent convenient to bonding. The carrier 82 could be the single layer or multiple layers and the tracing for the interconnection could be based on the structure of the detector. For example, if each pixel 52 is to be bonded directly to the carrier then the pads 84 are to be arranged based on the pitch of the pixel 52 (FIG. 26A). On the carrier, the interconnection 86 can be taken to the both side and bonding can be done (FIG. 26B). Requisite sized bumps 90 can be used for this purpose. The carrier 82 can have the capability to bond the detector array 58 and the integrated circuit 88. Sub-carrier (not shown here) can also be used only for bonding the detector array 58.

FIGS. 27A to 27B are the schematics showing the bonding technique of the photodiode array independently addressable in accordance to the present invention wherein the same parts are represented by the same numerals as shown in FIG. 26, so that repeated explanation is omitted here. In the preferred embodiment, the detector array having flat substrate attachment, carrier 92 which can be single layer or multiplayer having the groove just fit for the flat substrate 62 attached with detector 58. After bonding the detector 58 on the carrier 82, the gap 90 inside the groove can be filled with air or resin (insulating) material 96 which can absorb the heat and acts as the cushion for the whole detector.

In the preferred embodiment, top and bottom incident type photodiodes and their array are described. In the preferred embodiment, we have explained the fabrication process compatible for standard fabrication process. In the top-incident type photodiode array, the metal line can be fabricated to connect the each photodiode element with the outside pad using of the nano imprint technology or molding. This would help to increase the photodiode surface wider and/or to increase the fill-factor of the array. Increasing the fill-factor and also increasing the number of the elements in the array would help to increase the detection resolution. In the case of bottom incident type photodiode array, individually operated pixel can be bonded and in this case metal line is not required to draw from the photodiode surface. This increases the resolution of detection.

In the present invention, InGaAs is used the absorption layer and InP which block the absorption of the visible light and shorter wavelength are etched to extend the InGaAs absorption far below the shorter wavelength. To increase the spectrum bandwidth, various InGaAs contents may necessary. In the present invention, InP is used as the substrate, any kinds of semiconductor substrate and the structure can be used, which has lattice match with InGaAs. III-V substrate such as GaAs, InSb, or GaN etc. can be used with proper matching layer with InGaAs layer, which is used as the absorption layer.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the photodiode structure, which could provide the broad spectral detection capability ranges from <300 nm to as high as 1700 nm, high quantum efficiency>95%, and high frequency response (e.g. >10 GHz frequency response at 3 dB for the photodiode size of below 5 μm).

According to the present invention, it is our also object to provide the photodiode array of N×N elements which could also provide the broad spectral detection capability ranges from <300 nm to as high as 1700/2500 nm, high quantum efficiency>85%, and high frequency response (e.g. ~10 GHz frequency response at 3 dB for the photodiode size of 5 μm and the pitch of 10 μm). Better frequency response can also be expected if the metal line is designed as the transmission line of coplanar line or microstrip line types.

It is also our object to have the photodiode structure, which can provide stable spectral detection performance under wide range of temperature variation. Unlike a wide-wavelength wafer bonded photodiode, this present invented photodiode is capable of operating at any temperature with slight variation in the quantum efficiency for long wavelengths as the bandgap increases with decreasing temperature. At 5K, the bandgap of InGaAs increases to 0.81 eV (~1540 nm) while it is 0.75 eV (~1650 nm) at 300K. This will restrict the operating wavelengths to 1540 nm at 5K.

In the preferred embodiment, the photodiode array of N×N elements where each photodiode can be addressable independently is explained. Photodiode array having broad spectral detection ranges can also have the structure where the photodiode elements are connected by the two-axis electrode.

The present invention is expected to be found practically use in multiple purpose applications such as telecommunication, imaging (where CCD cannot be used), and also many sensing applications, and also in the applications including surveillance, satellite tracking, advanced lidar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photodiode array module comprising:
    a photodiode array having a first surface and a second surface,
        wherein the first surface of said photodiode array has a backside etch;
    a packaging layer comprising
        at least one insulating layer having a first surface and a second surface and
        at least one substrate having a first surface and a second surface;
            wherein the first surface of said at least one insulating layer is attached to the second surface of said photodiode array, and
            wherein the first surface of said at least one substrate is attached to the second surface of said at least one insulating layer;
    at least one carrier layer having a first surface,
        wherein the first surface of said at least one carrier layer has at least one groove;
    at least one integrated circuit element on the first surface of said carrier layer;
    at least one bump;
    at least one electrical signal line on the first surface of said carrier layer;
    wherein said photodiode array with attached said packaging layer overlays said at least one carrier layer such that said packaging layer fits into said groove of said carrier layer, leaving a gap between said packaging layer and said carrier layer,
    wherein said gap between said packaging layer and said carrier layer is filled with resin, and
    wherein said photodiode array is connected to said at least one bump, and said at least one bump overlays and is connected to said at least one electrical signal line; and
    said at least one electrical signal line is connected to said at least one integrated circuit element.

2. The photodiode array module according to claim 1, wherein said photodiode array is connected by two-axis electrodes to said at least one carrier layer.

3. The photodiode array module according to claim 1, further comprising at least one electrical pad,
    wherein said at least one electrical signal line is connected to each photodiode element in said photodiode array, and
    said at least one electrical signal line is connected to said at least one electrical pad,
    wherein said at least one electrical pad is not located on said at least one carrier layer.

4. The photodiode array module according to claim 1, wherein said photodiode array comprises:
    a first ohmic contact of a first conductivity type;
    an InP or GaAs substrate of said first conductivity type etched out from the backside so as to avoid absorption of incident light from the backside into said substrate, wherein said substrate is connected to said first ohmic contact;
    at least one semiconductor electric-field buffer layer of said first conductivity type formed at said substrate;
    at least one InGaAs absorption layer formed at said at least one buffer layer;
    at least one spacer layer formed at said at least one absorption layer and covering the entire said at least one absorption layer;
    at least one highly doped In-based ohmic contact layer of a second conductivity type opposite to said first conductivity type formed at said at least one spacer layer; and
    a second ohmic contact of said second conductivity type connected to said at least one contact layer.

5. The photodiode array module according to claim 4,
    wherein said first ohmic contact passes through said at least one contact layer, passes through said at least one spacer layer, passes through said at least one absorption layer, and is connected to any layer of said first conductivity type or said substrate;
    and wherein said first ohmic contact terminates on the open (top) side of said at least one contact layer, thereby allowing access to the said first ohmic contact from the top of the structure;
    and wherein said first ohmic contact is insulated from all other layers of the structure, except said semiconductor substrate and/or said at least one buffer layer, by a non conductive material.

6. The photodiode array module according to claim 4, wherein a multiplication layer does not exist between said at least one absorption layer and said at least one buffer layer.

7. The photodiode array module according to claim 1, wherein said at least one substrate is comprised of an integrated circuit element.

8. A photodiode array module comprising:
    a photodiode array having a first surface and a second surface,
        wherein the first surface of said photodiode array has a backside etch,
    at least one bump;
    at least one carrier layer having a first surface;
    at least one integrated circuit element on said at least one carrier layer;
    at least one electrical signal line on the first surface of said at least one carrier layer;
    at least one electrical pad on the first surface of said at least one carrier layer,
    wherein said photodiode array overlays and is connected to said at least one bump, and said at least one bump overlays and is connected to said at least one electrical pad; and
    wherein the stacking of said photodiode array, said at least one bump, and said at least one electrical pad forms at least one column that otherwise leaves a gap between said photodiode array and said carrier layer; and
    wherein said at least one electrical signal line connects said at least one integrated circuit element to said at least one electrical pad;
    wherein said photodiode array comprises:

a first ohmic contact of a first conductivity type;

an InP or GaAs substrate of said first conductivity type etched out from the backside so as to avoid absorption of incident light from the backside into said substrate, wherein said substrate is connected to said first ohmic contact;

at least one semiconductor electric-field buffer layer of said first conductivity type formed at said substrate;

at least one InGaAs absorption layer formed at said at least one buffer layer;

at least one spacer layer formed at said at least one absorption layer and covering the entire said at least one absorption layer;

at least one highly doped In-based ohmic contact layer of a second conductivity type opposite to said first conductivity type formed at said at least one spacer layer; and a second ohmic contact of said second conductivity type connected to said at least one contact layer, wherein a multiplication layer does not exist between said at least one absorption layer and said at least one buffer layer.

9. The photodiode array module according claim 8, wherein the gap between said photodiode array and said carrier layer is filled with resin.

10. The photodiode array module according claim 8, wherein said photodiode array is connected by two-axis electrodes to said at least one carrier layer.

11. The photodiode array module according to claim 8, wherein said at least one electrical pad is an array of electrical pads aligned with each pixel element of said photodiode array.

12. The photodiode array module according to claim 8, wherein the size of the said bumps is variable as required.

13. The photodiode array module according to claim 8, wherein the number of said electrical pads equals the number of pixel elements of said photodiode array for electrical connections.

14. The photodiode array module according to claim 8, wherein said first ohmic contact passes through said at least one contact layer, passes through said at least one spacer layer, passes through said at least one absorption layer, and is connected to any layer of said first conductivity type or said substrate;

and wherein said first ohmic contact terminates on the open (top) side of said at least one contact layer, thereby allowing access to the said first ohmic contact from the top of the structure;

and wherein said first ohmic contact is insulated from all other layers of the structure, except said semiconductor substrate and/or said at least one buffer layer, by a non conductive material.

15. The photodiode array module according to claim 8, wherein said at least one electrical pad is a plurality of electrical pads disposed to the side of said photodiode array, such that none of said electrical pads are directly underlying the pixel elements of said photodiode array, and said electrical pads are electrically connected to each pixel element of said photodiode array.

16. The photodiode array module according to claim 8, wherein said at least one integrated circuit element is on the first surface of said at least one carrier layer.

* * * * *